United States Patent
Haugestuen et al.

(10) Patent No.: US 8,332,802 B2
(45) Date of Patent: Dec. 11, 2012

(54) SYSTEMS, METHODS, AND PROGRAMS FOR LEAKAGE POWER AND TIMING OPTIMIZATION IN INTEGRATED CIRCUIT DESIGNS

(75) Inventors: Benjamin P. Haugestuen, Fort Collins, CO (US); Howard L. Porter, Loveland, CO (US); Richard Rodgers, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 158 days.

(21) Appl. No.: 12/911,156

(22) Filed: Oct. 25, 2010

(65) Prior Publication Data
US 2012/0102448 A1 Apr. 26, 2012

(51) Int. Cl.
*G06F 17/50* (2006.01)
(52) U.S. Cl. ........................... 716/134; 716/133
(58) Field of Classification Search .................. 716/108, 716/113, 134, 133
See application file for complete search history.

(56) References Cited

U.S. PATENT DOCUMENTS

| | | | |
|---|---|---|---|
| 7,448,009 B2 | 11/2008 | Pundoor | |
| 7,496,867 B2 | 2/2009 | Turner et al. | |
| 7,551,985 B1 | 6/2009 | Chen et al. | |
| 2008/0189662 A1 | 8/2008 | Nandy et al. | |
| 2009/0055780 A1 | 2/2009 | Acar et al. | |
| 2010/0050144 A1* | 2/2010 | Zahn | 716/9 |
| 2010/0153897 A1* | 6/2010 | Zahn | 716/9 |
| 2010/0169847 A1* | 7/2010 | Gupta et al. | 716/2 |

* cited by examiner

*Primary Examiner* — Vuthe Siek

(57) ABSTRACT

A method, system and program for reducing or optimizing leakage power consumption in an integrated circuit produced in accordance with an integrated circuit model. A fast corner timing database and configurable timing constraints are used in conjunction with hold cell logic to identify a set of cells that should not be modified. A leakage optimization procedure is responsive to a slow corner timing database and timing constraints for a slow corner. The procedure is configurable and includes the repair of register transition violations. The procedure is performed on a select number of paths before an adjusted timing slack value is determined and cells are addressed in response to the number of failing timing paths associated with a cell. Some embodiments generate information in a router compatible format that identifies a desired modification to the top-level integrated circuit design.

17 Claims, 21 Drawing Sheets

SYSTEMS, METHODS, AND PROGRAMS FOR LEAKAGE POWER AND TIMING OPTIMIZATION IN INTEGRATED CIRCUIT DESIGNS

BACKGROUND

Integrated circuit design involves assembling a model from a combination of circuits that perform desired functions. Generally, the combination of circuits is constructed from building blocks called cells. Each cell performs a specific function and has a defined set of inputs and outputs. The different cells are deployed as necessary in the model to meet differing needs. A selected mix of such cells from the library is arranged in the model depending upon the desired function of the integrated circuit.

The set of such cells available to an integrated circuit designer is stored in a library of cells. A cell library may comprise a hundreds or even thousands of cells corresponding to primitive function circuits, such as inverters, NAND gates, NOR gates, more complex Boolean function circuits and even sequential elements like latches and flip-flops. A cell may itself be defined in terms of a netlist that includes a cell model that specifies logical, electrical, and physical attributes and that may include one or more smaller circuits. Other cell attributes provide information concerning a variety of the cell's characteristics such as timing, area, power dissipation, testability and threshold voltage, for example.

A crucial factor in the performance of an integrated circuit is the cell to cell timing of clock and data signals. Complex circuits often include cells arranged in sequence with one or more cell outputs driving another cell's input. Integrated circuits are typically clock rate driven. Consequently, many such serial chains of cells must provide their outputs before the expiration of an interval of time. Proper circuit function depends upon meeting such timing restraints in virtually all of the integrated circuit. Accordingly, input and output signal timing requirements of the integrated circuit model are checked to verify that the model can be used to produce an integrated circuit that performs in a desired way over a range of operating conditions.

The library of cells can include a variety of cells that perform the same function. For example, a cell library may include multiple different cells that perform a two-input NAND logic function, but each such functionally equivalent cell may employ transistors having different threshold voltages. A cell with transistors that have a relatively lower threshold voltage will switch faster than a comparative cell with transistors that have a higher threshold voltage. Thus, it is common for circuit designers to select a cell with transistors that have a lower threshold voltage when the cell is in a critical timing path. However, cells that include transistors with a relatively lower threshold voltage consume much more power when the cell is not in use. The power consumed when a cell is not in use is often known as leakage power.

The inherent trade-off between power dissipation and switching speed when selecting between cells having different threshold voltages created a need for an analysis system and method that would seek a suitable balance between leakage power consumed and integrated circuit timing constraints. Leakage optimization techniques have been deployed within placement and routing tools for modeling an integrated circuit.

However, use of these optimization techniques in placement and routing tools has been problematic. For example, some placement and routing tools cannot optimize an integrated circuit design to provide less than a desired percentage of low threshold voltage cells. Still other placement and routing tools cannot define an integrated circuit design that would achieve a desired timing margin. For some of these situations, it was discovered that even when a desired timing margin is not achieved, the placement and routing tool does not apply a solution using all low voltage threshold cells on the path. In other situations, it was discovered that low voltage threshold cells are applied in non-critical timing paths even when these paths have sufficient timing margins.

Furthermore, poor correlation between estimated delays used in an initial timing analysis in placement and routing tools and delays in a more robust final timing analysis that uses parasitic resistances and capacitances extracted from actual metal routes and transistor placement results in at least two additional problems when placement and routing tools are used to optimize the usage of low voltage threshold cells in an integrated circuit design. When a leakage optimization is performed using the less accurate estimated delays, and the correlation between the estimated delays and the delays derived from parasitic values is poor, it is often the case that any timing margin in the preliminary routing has been removed as a result of the leakage optimization. Often, when the more accurate final timing analysis is performed, many paths will fail to meet the required timing for the circuit to function across a desired range of operating conditions. Any paths that fail to meet the desired timing margin have to be readdressed and corrected. In an effort to reduce or eliminate the number of timing failures identified in a final timing analysis of a circuit, integrated circuit designers are motivated to increase the cell-to-cell timing margins used by the placement and routing tool. While increasing the cell-to-cell timing margin may make it possible to meet all timing constraints in the final timing analysis, it is likely that a significant number of low threshold voltage cells have been unnecessarily introduced in the circuit design. Thus, adding to the leakage power that will be dissipated in the integrated circuits constructed using the design.

SUMMARY

The present systems, methods, and programs for leakage power and timing optimization in integrated circuit models operate with a final timing database and provide a user configurable solution that preserves hold timing margin for an integrated circuit design while optimizing the use of functionally equivalent cells implemented with transistors using different threshold voltages or via alternative circuit arrangements that reduce overall power consumption in an integrated circuit produced from the design. In addition, when it is determined that desired transition times cannot be met, the present systems, methods, and programs generate commands compatible with placement and routing tools that dictate a change in the integrated circuit design.

An embodiment comprises a method for optimizing power consumption and timing in an integrated circuit design. Briefly described, the method comprises the steps of receiving configuration information including an integrated circuit model generated by a placement and routing tool, path specific variables, and a first run-time option associated with a timing path group, preserving timing critical hold paths, performing a leakage optimization analysis on the integrated circuit, the leakage optimization analysis configurable in accordance with the path specific variables and including a routine that repairs register transition violations, wherein the leakage optimization analysis is performed on a select number of paths before an adjusted timing slack value is determined and wherein cells are addressed in response to the number of failing timing paths associated with a cell, the leakage optimization analysis storing cell instances and types in a second store, swapping cells with specified cell types, updating a timing database in response to the modified cells, identifying and storing transition violations in a third store and generating information in a router compatible format that identifies a desired modification of the integrated circuit design.

An alternative embodiment comprises a non-transitory program embodied in a computer-readable medium for optimizing power consumption and verifying timing in an integrated circuit design. Briefly described, the program comprises logic configured to load a configuration file, iteratively load a fast corner timing database and timing constraints and direct the execution of logic in a hold cell module configured to identify cells in hold timing paths, logic configured to iteratively load a slow corner timing database and timing constraints and direct the execution of logic that performs a leakage power optimization analysis of the integrated circuit design, the leakage power optimization analysis ignoring cells in hold timing paths and repairing register transition violations, wherein the leakage optimization analysis is performed on a select number of paths before an adjusted timing slack value is determined and wherein cells are addressed in response to the number of failing timing paths associated with a cell, logic configured to iteratively load a slow corner timing database and timing constraints and direct the execution of logic that generates data responsive to a modified integrated circuit design responsive to the leakage power optimization analysis, the logic further configured to save a timing session and direct the execution of logic that generates information in a router compatible format that identifies a desired modification of the integrated circuit design and logic configured to iteratively load a fast corner timing database and timing constraints and direct the execution of logic that generates data responsive to the modified integrated circuit design, the logic further configured to save the timing session by overwriting changes to a previously stored timing session.

Another embodiment comprises an integrated circuit model analysis system. Briefly described, the system comprises an interface, a memory and a processor. The interface receive a set of operational parameters that define a cell library, slow and fast corner timing databases, timing constraints, a number of paths to be analyzed simultaneously and a number of iterations to be used when generating transition change orders. The memory contains a static timing model of an integrated circuit design under test, the static timing model comprising a plurality of blocks with circuit paths including cells. The memory further includes manager, hold cell, leakage optimizer, initializer, register transition repair and data transformer modules. The memory further includes capacity for storing configuration, interim and output data files. The memory and the interface are coupled to the processor. The processor executes commands stored in the manager, hold cell, leakage optimizer, initializer, register transition repair, and data transformer modules in the memory. The commands direct the processor to identify cells in hold timing paths and perform a leakage optimization analysis on the integrated circuit model. The leakage optimization analysis is performed on a select number of paths before an adjusted timing slack value is determined. Cells are addressed in response to the number of failing timing paths associated with a cell. After the leakage optimization results have been stored, the processor executes commands that direct the processor to swap cells with specified cell types, update a timing database in response to the modified cells, identify and store transition violations in the memory and generate information in a router compatible format that identifies a desired modification of the integrated circuit model.

Other systems, methods, features and advantages will be or will become apparent to one skilled in the art upon examination of the following figures and detailed description of the improved leakage power and timing optimizer. All such additional systems, methods, features and advantages are defined and protected by the accompanying claims.

BRIEF DESCRIPTION OF THE DRAWINGS

The present methods, programs and systems for optimizing power consumption and timing in an integrated circuit design, as defined in the claims, can be better understood with reference to the following drawings. The components within the drawings are not necessarily to scale relative to each other; emphasis instead is placed upon clearly illustrating the principles for preserving hold timing margin for an integrated circuit design while optimizing the use of functionally equivalent cells to achieve a design that meets timing requirements while optimizing leakage power consumption in an integrated circuit constructed in accordance with the integrated circuit design.

DETAILED DESCRIPTION

The present systems, methods, and programs for leakage power optimization in integrated circuit models operate with a final timing database and provide a user configurable solution that preserves hold timing margin for an integrated circuit design while optimizing the use of functionally equivalent cells implemented with transistors using different threshold voltages or via alternative circuit arrangements that reduce overall power consumption in an integrated circuit produced from the design. In addition, when it is determined that desired transition times cannot be met, the present systems, methods, and programs generate commands compatible with placement and routing tools that dictate a change in the integrated circuit design.

Figure 1:
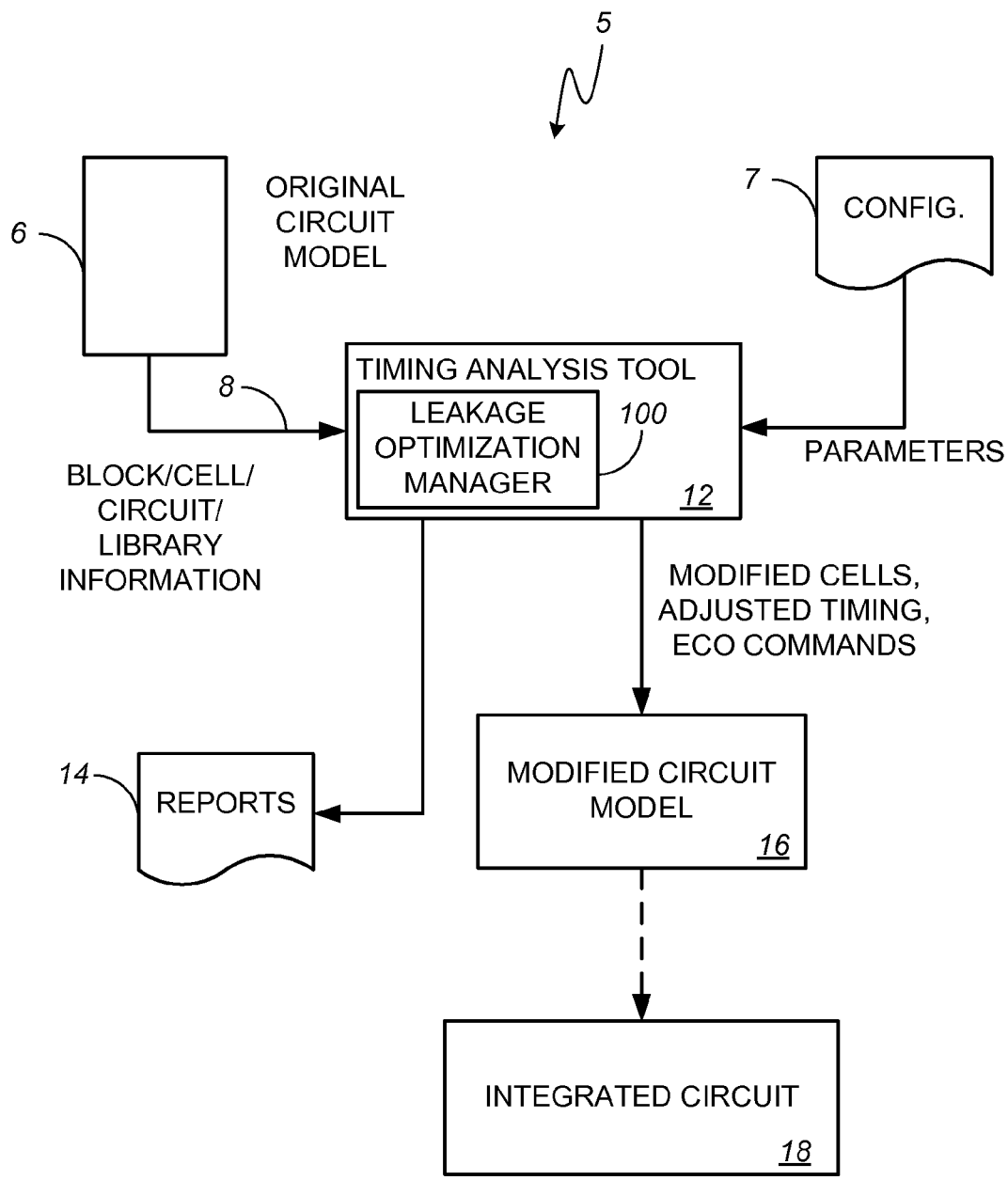
FIG. 1 is a functional block diagram illustrating an embodiment of an integrated circuit design environment.

FIG. 1 is a functional block diagram illustrating an embodiment of an integrated circuit design environment 5. Design environment 5 includes a timing analysis tool 12 that receives information 8 from an original circuit model 6. The information 8 includes hierarchically arranged information including block, cell, path, clock, and connectivity information. The information 8 may further include one or more cell libraries that include functionally equivalent cells that are configured using transistors with different threshold voltages and/or alternative internal circuit elements when embodied in an integrated circuit consume different leakage powers.

As indicated above, semiconductor devices with relatively lower switching thresholds can be used to accelerate the timing in a select path. However, semiconductor devices with lower switching thresholds consume relatively more power even when the semiconductor devices are not being used to switch or process data signals. The power consumed when the semiconductor devices are "off" or not being used is known as leakage power.

As illustrated in FIG. 1, the timing analysis tool 12 also receives configuration information 7. The configuration information 7 includes parameters that direct a leakage power analysis manager or manager 100 associated with the timing analysis tool 12 in the execution of a leakage optimization procedure configured to generate reports 14 and communicate information concerning modified cells, adjusted timing and commands for directing a change to the top-level or original circuit model 6. The modified cells, adjusted timing and commands can be used to generate a modified circuit model 16 from the original circuit model 6. The modified circuit model 16 contains an optimized or minimum number of cells using lower threshold transistors to achieve desired timing constraints. As further indicated in FIG. 1, the modified circuit model 16 can be used to produce integrated circuit 18 in accordance with known integrated circuit manufacturing techniques.

Figure 2:
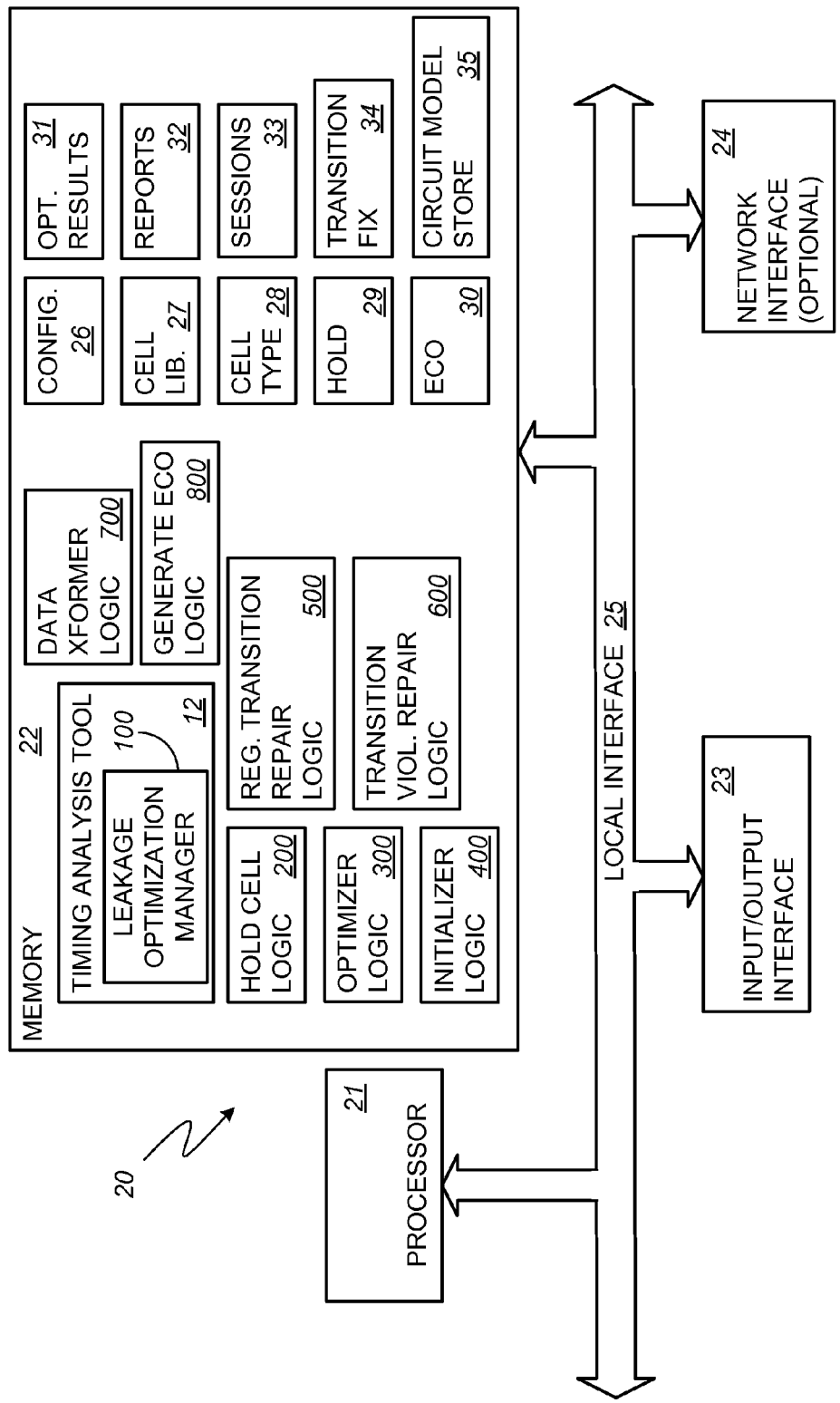
FIG. 2 is a functional block diagram illustrating an embodiment of a circuit model analysis system.

FIG. 2 is a functional block diagram illustrating an embodiment of a circuit model analysis system 20 that can be used to enable the timing analysis tool 12 and leakage optimization manager 100 of FIG. 1. When the logic used by circuit model analysis system 20 is implemented in software, as is shown in FIG. 2, it should be noted that one or more of the leakage optimization manager 100, hold cell logic 200, optimizer logic 300, initializer logic 400, register transition repair logic 500, transition violation repair logic 600, data transformer logic 700 and the generate engineering change order (ECO) logic 800 as well as information in multiple data stores, examples of which are illustrated in FIG. 2, may be stored on any computer-readable medium for use by or in connection with any computer-related system or method. The term logic is used to describe a self-contained collection of executable instructions that is used in combination with other components to transform data, optimize results, and generate reports and commands.

In the context of this document, a computer-readable medium is an electronic, magnetic, optical, or other physical device or means that can contain or store a computer program and data for use by or in connection with a computer-related system or method. The various logic elements and data stores may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, for instance via optical scanning of the paper or other medium, then compiled, interpreted or otherwise processed in a suitable manner if necessary, and then stored in a computer memory. As described herein, a self-contained collection of executable instructions stored in a non-transitory state on a computer-readable medium is a module.

In an alternative embodiment, where circuit model analysis system 20 is implemented in hardware, it may be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In terms of hardware architecture, as shown in FIG. 2, circuit model analysis system 20 includes a processor 21, memory 22, input and/or output (I/O) interface(s) 23, and (optional) network interface 24 that are in communication with each other via local interface 25. Local interface 25 can be, for example but not limited to, one or more buses or other wired or wireless connections, as is known in the art. The local interface 25 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 21 is a hardware device for executing software, particularly software stored in memory 22. The processor 21 can also access (i.e., read) data stored in the memory 22 and write data to the memory 22. The processor 21 can be any custom made or commercially available processor, a central processing unit (CPU), an auxiliary processor among several processors associated with circuit model analysis system 20, a semiconductor based microprocessor (in the form of a microchip or chip set), or generally any device for executing software instructions.

Memory 22 may include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 22 may incorporate electronic, magnetic, optical, and/or other types of storage media. Note that the memory 22 can have a distributed architecture, where various components are situated remote from one another, but can be accessed by the processor 21.

Figure 3:
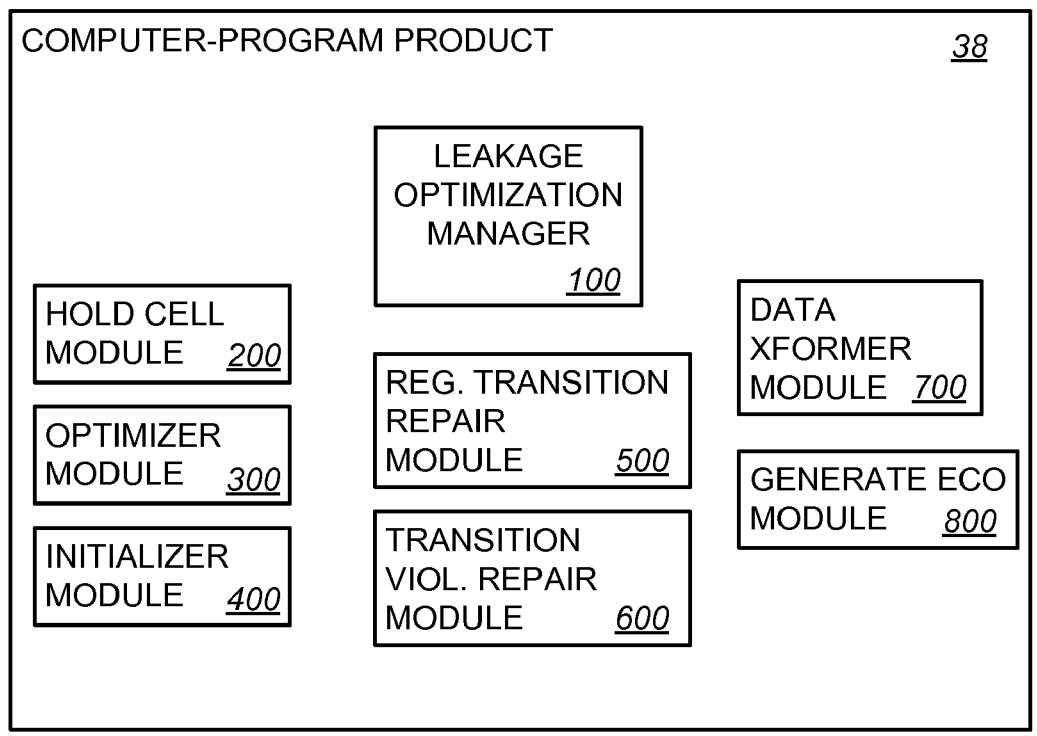
FIG. 3 is a functional block diagram illustrating an embodiment of a computer-program product.

The software in memory 22 may include one or more separate programs, each of which comprises an ordered listing of executable instructions for implementing logical functions. In the example of FIG. 3, the software in the memory 22 includes the leakage optimization manager 100, hold cell logic 200, optimizer logic 300, initializer logic 400, register transition repair logic 500, transition violation repair logic 600, data transformer logic 700 and the generate engineering change order (ECO) logic 800. Memory 22 will generally include a suitable operating system (O/S) (not shown) and perhaps other application(s) or programs. The operating system essentially controls the execution of other computer programs, such as portions of circuit model analysis system 20 and provides scheduling, input-output control, file and data management, memory management, and communication control and related services.

It will be appreciated that functional portions of circuit model analysis system 20 may be a source program, executable program (object code), script, or any other entity comprising a set of instructions to be performed. When a source program, the program needs to be translated via a compiler, assembler, interpreter, or the like, may or may not be included within the memory 22, so as to operate properly in connection with an operating system (not shown). Furthermore, portions of circuit model analysis system 20 may be written in (a) an object oriented programming language, which has classes of data and methods, or (b) a procedure programming language, which has routines, subroutines, and/or functions.

I/O interface(s) 23 may include circuits and buffers for coupling input devices, for example but not limited to, a keyboard, mouse, scanner, microphone, etc. to local interface 25. I/O interface(s) 23 may also include circuits and buffers for coupling data storage devices (not shown) or output devices, for example but not limited to, a printer, display, etc. to local interface 25.

Network interface 24 may comprise the various components used to transmit and/or receive data over a network. By way of example, the network interface 24 may include a device that can communicate both inputs and outputs, for instance, a modulator/demodulator (e.g., modem), wireless (e.g., radio frequency (RF)) transceiver, a telephonic interface, a bridge, a router, network card, etc.

In addition to the leakage optimization manager 100, hold cell logic 200, optimizer logic 300, initializer logic 400, register transition repair logic 500, transition violation repair logic 600, data transformer logic 700 and the generate engineering change order (ECO) logic 800, the memory 22 includes storage capacity for holding information such as configuration store 26, cell library store 27, cell type store 28, hold cell store 29, ECO store 30, optimization results store 31, reports store 32, sessions store 33, transition fix store 34 and a circuit model store 35. Although shown as separate and distinct storage containers or files, it should be understood that the contents of the configuration store 26, cell library store 27, cell type store 28, hold cell store 29, ECO store 30, optimization results store 31, reports store 32, sessions store 33, transition fix store 34 and a circuit model store 35 can be integrated in a database dedicated for holding information associated with a specified integrated circuit design.

However organized and stored, the configuration file 26 includes parameters that when applied by the leakage optimization manager 100 and the various other logic/modules, identify the integrated circuit model and provide parameters that direct execution of the leakage optimization logic. The cell library store 27 includes information defining alternative cells implemented with transistors having different threshold voltages. The cell type store 28 includes information defining an alternative cell that can be swapped into the integrated circuit design to replace a cell that performs an identical logical function. The hold cell store 29 includes information that identifies cells that will not be swapped. The ECO store 30 includes commands that direct a change in the integrated circuit design. The optimizer results store 31 includes information that identifies the percentage of LVT, SVT, and HVT cells that are used in a modified circuit design after operation of the leakage optimization manager 100. Reports store 32 includes information generated by the leakage optimization manager 100 and the various other subroutines or logic modules. Sessions store 33 includes timing information for a leakage optimized integrated circuit design. Transition fix store 34 includes information identifying cells, counters, pins, timing violations, etc. Circuit model store 35 includes information identifying an integrated circuit design.

FIG. 3 is a schematic diagram illustrating an embodiment of a computer-program product 38. The computer-program product 38 includes the leakage optimization manager 100, hold cell module 200, optimizer module 300, initializer module 400, register transition repair module 500, transition violation repair module 600, data transformer module 700 and the generate ECO module 800. The architecture, operation, and/or functionality of an example embodiment of the leakage optimization manager 100 is described in detail in association with the flow diagram of FIG. 4. The architecture, operation, and/or functionality of an example embodiment of the hold cell logic 200 is described in detail in association with the flow diagram of FIG. 5. The architecture, operation, and/or functionality of an example embodiment of the optimizer logic 300 is described in detail in association with the flow diagram of FIG. 6. The architecture, operation, and/or functionality of an example embodiment of the initializer logic 400 is described in detail in association with the flow diagram of FIG. 7. The architecture, operation, and/or functionality of an example embodiment of the register transition repair logic 500 is described in detail in association with the flow diagram of FIG. 8. The architecture, operation, and/or functionality of an example embodiment of the transition violation repair logic 600 is described in detail in association with the flow diagram of FIG. 9. The architecture, operation, and/or functionality of an example embodiment of the data transformer logic 700 is described in detail in association with the flow diagram of FIG. 10. The architecture, operation, and/or functionality of an example embodiment of the generate ECO logic 800 is described in detail in association with the flow diagram of FIG. 11.

Inputs

The leakage optimization manager 100 takes advantage of save_session and restore_session commands available in a timing analysis tool to quickly read in and write out timing databases. The leakage optimization manager 100 uses the saved timing sessions from static timing analysis runs as a starting point for its optimization. Because the leakage optimization manager runs inside of a timing analysis tool, the leakage optimization manager 100 can easily restore these timing sessions and gather timing and design data for the block it is optimizing. The leakage optimization manager 100 is customizable and provides many options for the user to set in a configuration store or file 26. The following list includes some examples of parameters or information that can be specified in the configuration file 26:

Data about your low-voltage threshold (LVT), standard voltage threshold (SVT), and high-voltage threshold (HVT) cell libraries. This data can include switching speed and naming information. The data may further specify whether the cells having different voltage thresholds will be used for leakage optimization.

Specify which timing corners to use for hold analysis and for leakage optimization. Timing of an ASIC design can vary greatly due to many factors (process, voltage, and temperature variation are a few examples). A timing corner represents the design at a specific process, voltage, and temperature. An imaginary box, bounding the variation of these factors, represents the worst case limits of this variation. A timing corner is defined at an intersection of the variation of these factors.

Specify setup slack targets for each path group or for multiple path groups (using wildcards).

Specify a hold slack target for the hold path analysis.

Specify whether or not to use path recalculation or path based analysis (enable_recalc). This is a feature provided by the timing analysis tool that improves timing accuracy, often at the expense of total runtime.

If path recalculation is used, specify a recalc_slack_target to be met before path recalculation is enabled.

If path recalculation is used, specify which path groups can be recalculated.

Option to exclude input or output paths (paths in and out of the block) from being optimized. This may be useful if the input and output delay constraints are not very accurate.

Specify the maximum number of paths to be worked on at a time. Adjustment of this parameter can significantly reduce the total runtime.

Specify the maximum number of iterations to be used when finding transition ECOs (eco_max_iter).

Specify whether or not to try and upsize a driver cell when determining ECOs to fix transition times.

Specify cells that should be forced to LVT, SVT, or HVT.

Specify timing constraints or commands to be applied to the timing database. Useful for adding false or multicycle paths, setting dont_touch attributes on cells, changing clock uncertainties, or modifying the timing database.

The Leakage Optimization Manager

The leakage optimization manager 100 runs inside of a timing analysis tool. Thus, a timing session is initiated or started by invoking a shell command compatible with the timing analysis tool which sources the leakage optimization manager code and the various modules, procedures, or subroutines called by the leakage optimization manager 100. Several flow charts (FIGS. 4A-11C) are provided to illustrate how the leakage optimization manager 100 and its subroutines work.

Figure 4A:
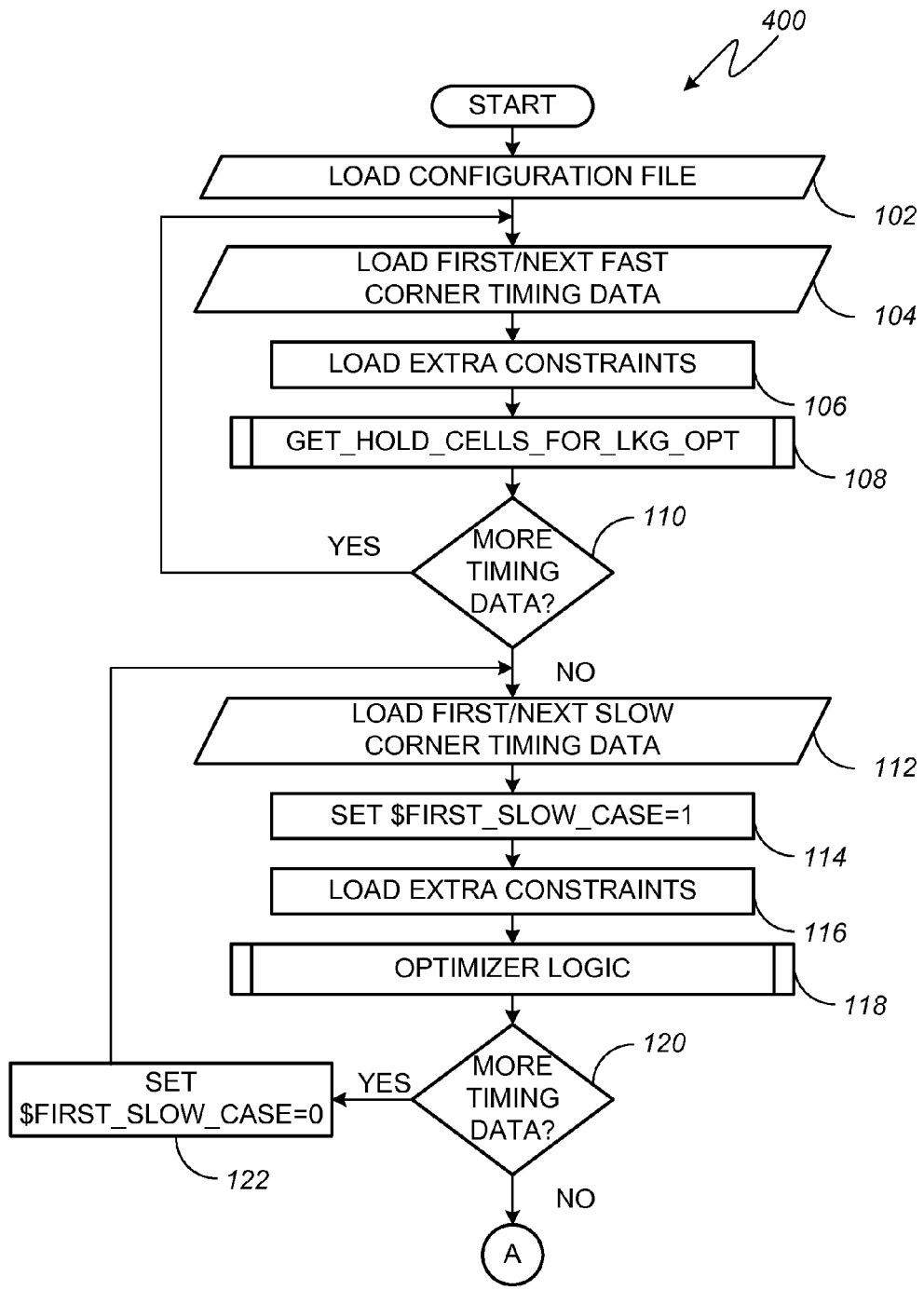
FIGS. 4A and 4B include flow diagrams illustrating an example embodiment of the optimization manager of FIG. 2 and FIG. 3.
Figure 4B:
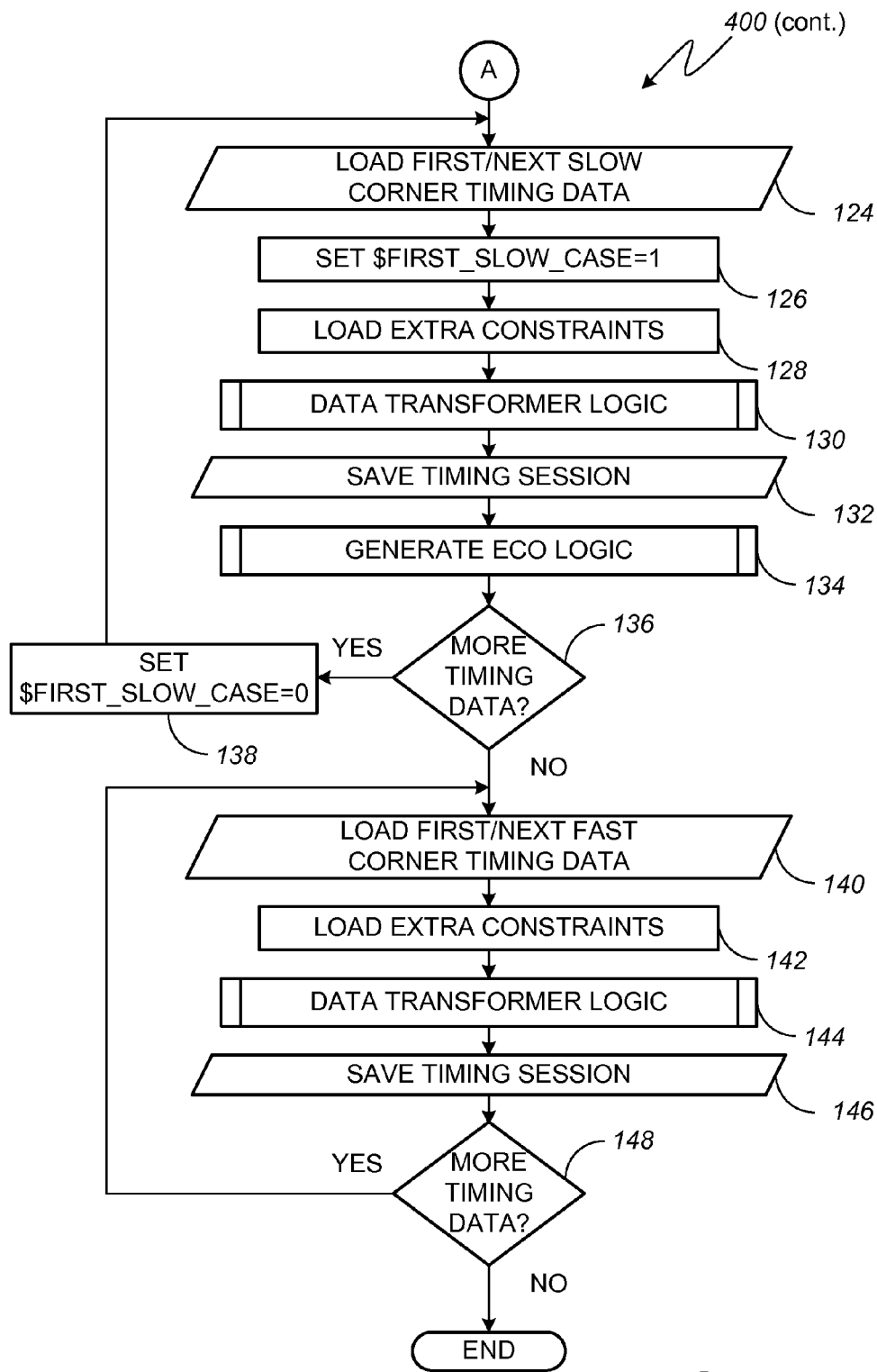

Operation of the leakage optimization manager 100 is illustrated in the flow chart shown in FIGS. 4A-4B. The first step of the procedure starts with block 102, where the configuration store or file 26 is read. The configuration file 26 provides necessary information to the leakage optimization manager 100 about the cell libraries, timing corners, slack targets, and other processing options/parameters to be used when performing a leakage optimization.

Before optimizing (i.e., modifying) leakage power and setup timing paths, timing critical hold paths are preserved so no new hold timing failures are introduced by the leakage optimization manager 100. Therefore, the next step in the procedure is performed in block 104, where the first fast corner timing database is read in. Any extra constraints/commands specified in the configuration file 26 are executed in block 106. After applying any new constraints/commands, the hold cell logic 200 (get_hold_cells_for_lkg_opt) procedure in block 108 is executed.

Figure 5:
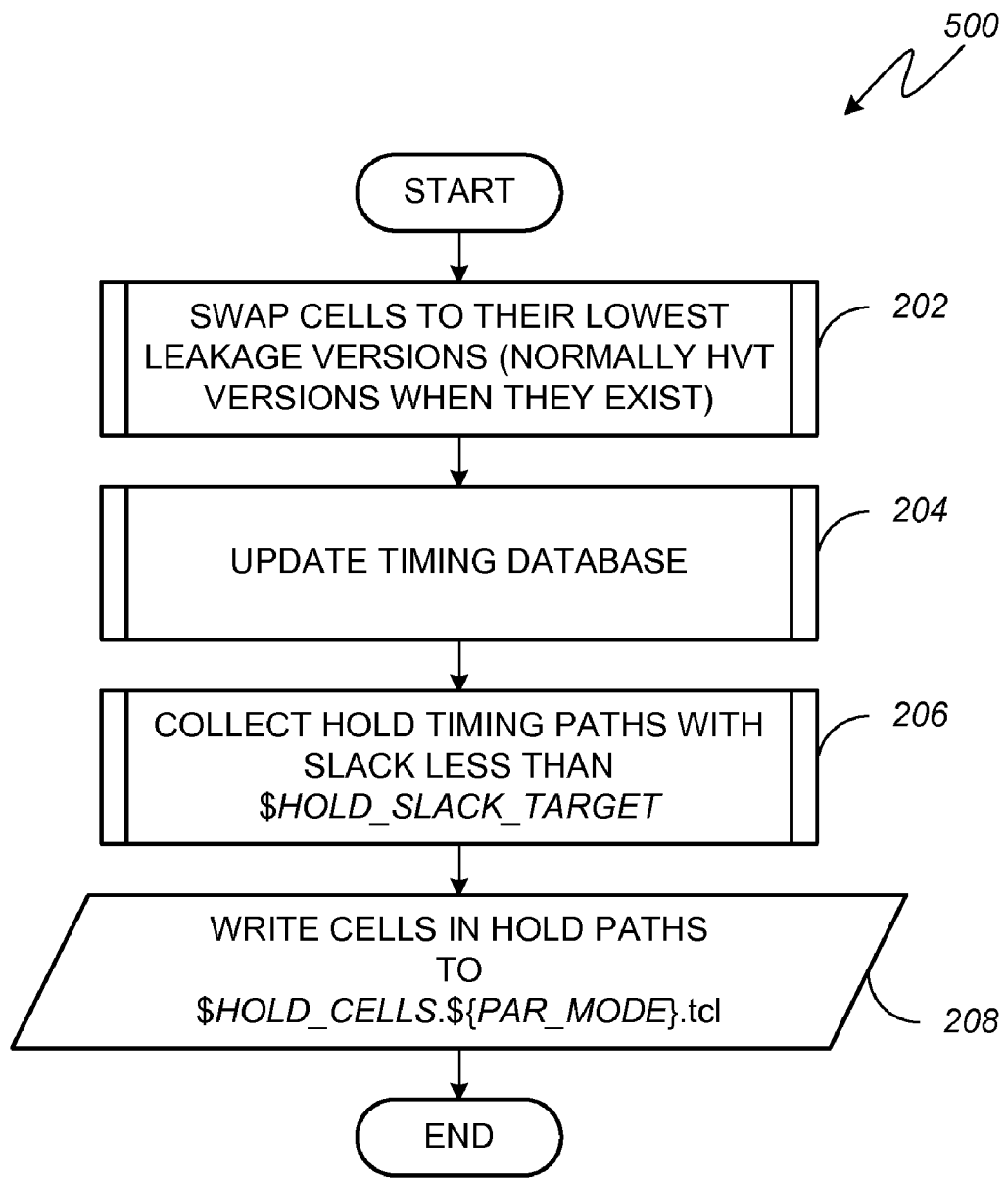
FIG. 5 is a flow diagram illustrating an example embodiment of the hold cell logic/module of FIG. 2 and FIG. 3.

An example embodiment of the hold cell logic 200 is illustrated in the flow diagram of FIG. 5. The first step (block 202) is to swap cells in the design (except for clock cells and dont_touch cells) to their lowest leakage or slowest versions. An example of this would be to swap a SVT buffer cell to its equivalent HVT buffer cell. (NOTE: Clock cells are already optimized for skew, latency, transition times, and power. Therefore, the leakage optimization manager 100 does not adjust clock cells). After cells have been swapped, the timing database is updated to reflect the slower processing time. This is done in block 204. When the timing database is up to date, a collection of hold timing paths with slack less than hold_slack_target (a variable specified in the configuration file 26) is created in block 206. Only paths inside the block are considered. Any hold timing failures on input or output paths are fixed by placing hold buffers or repeaters at the top level design of the integrated circuit. Then, in block 208, cells in each of the hold timing paths are collected and written out to a file or store such as hold store 29 (e.g., hold_cells.${par_mode}.tcl). The file will be read in later and used to set a dont_touch attribute on the cells in the file. This prevents these cells from being sped up, which could result in new hold timing failures.

When the procedure defined by the hold cell logic 200 (e.g., get_hold_cells_for_lkg_opt) is complete, decision block 110 (FIG. 4A) checks if there are more fast corner timing databases to analyze. If so, the leakage optimization manager 100 will return to block 104 and continue looping until a hold_cells.${par_mode}.tcl file for each fast timing corner has been created.

After the hold cells are recorded, the leakage optimization manager 100 will start looping through all the slow timing corners and will optimize timing and leakage power for each corner. This starts with block 112, where the first slow corner timing database is loaded. In block 114, the first_slow_case variable is set to 1. This will be used later on by the optimizer logic 300 (e.g., the optimize_leakage procedure). Any user specified extra constraints/commands for the slow case timing corners are applied in block 116. Then, in block 118, the optimizer logic 300 is executed. This procedure is responsible for the bulk of the work (and runtime) in the leakage optimization process.

An example embodiment of the optimizer logic 300 is shown in FIGS. 6A-6F. The first step of this procedure (block 302) is to determine which libraries are available for leakage optimization. This information will be used when the optimizer logic 300 (e.g., optimize_leakage) is making decisions about whether or not faster versions or lower leakage versions of cells are available. The next step (block 304) is to read in each hold cell defined in the hold store 29 (e.g., hold_cell.${par_mode}.tcl) or file and mark the cells in those files as hold_cells. The procedure continues by marking the clock cells and any user specified cells as dont_touch in block 306. Then, in block 308, the initiliazer logic 400 (e.g., initialize_variables procedure) is executed.

Figure 7:
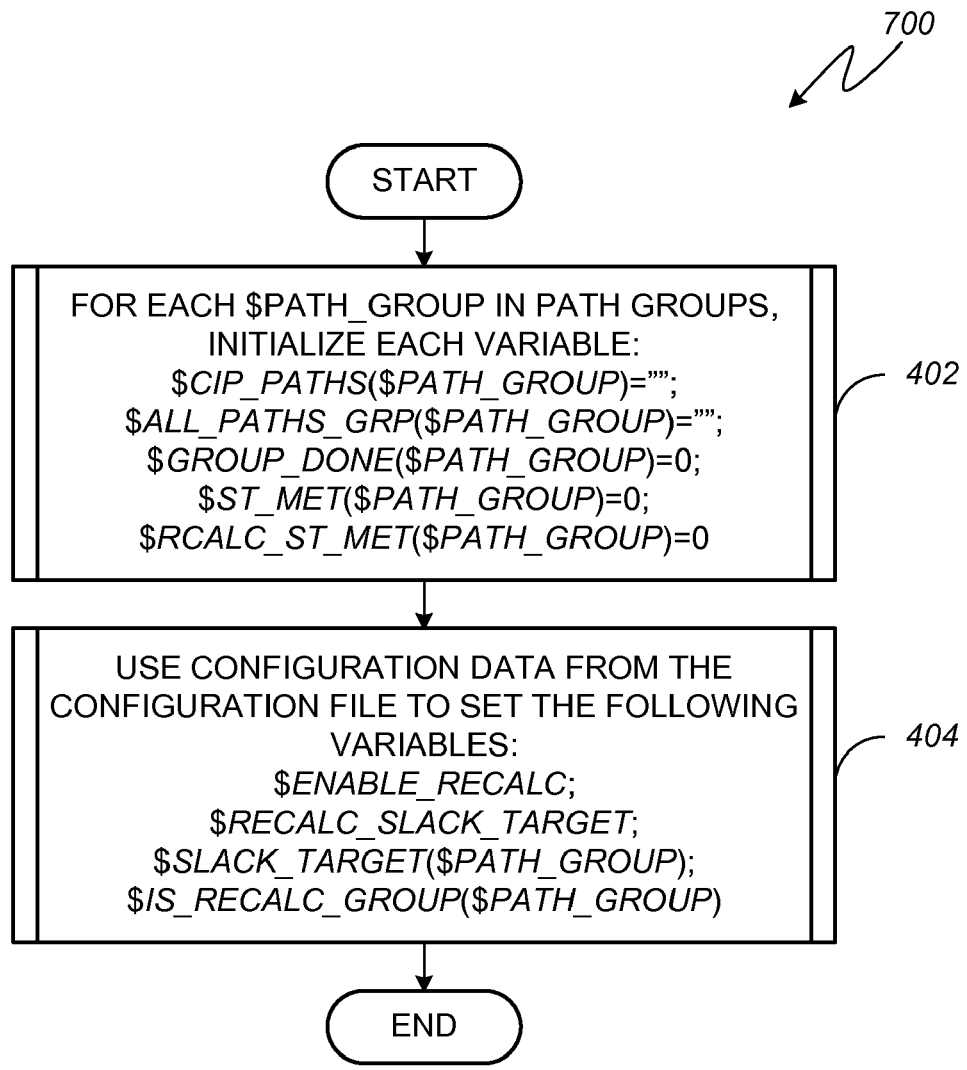
FIG. 7 is a flow diagram illustrating an example embodiment of the initializer logic/module of FIG. 2 and FIG. 3.

An example embodiment of the initializer logic 400 is shown in FIG. 7. In block 402, the procedure loops through each existing path_group for the design and applies default values to variables. A path_group is a group of paths that share a common trait. An example path_group would be clktoclk(ClkA), where the group contains paths that were launched by ClkA and captured by ClkA. The following variables are initialized:

cip_paths($path_group)=" "; This is a collection of paths that already contain the fastest possible cells and can't be improved. If these paths fail timing, they will show up each time the tool collects failing timing paths. Therefore, these paths are identified and removed from the remainder of the failing paths. If the only remaining failing paths are cip_paths, then there is no more timing optimization that can be done. (NOTE: Setting the variable to " " creates an empty collection with size=0).

all_paths_grp($path_group)=" "; This is a collection of all failing paths for a particular path_group.

group_done($path_group)=0; This variable is set to 1 when all the paths in a path_group have been optimized.

st_met($path_group)=0; This variable is set to 1 when the slack_target for a path_group has been met. The slack for a timing path is the amount of positive (or negative) timing margin related to a path's timing budget. If the slack is negative, the path did not meet it's timing budget. The slack_target is the amount of timing margin that is desired for a path or path_group.

rcalc_st_met($path_group)=0; This variable is set to 1 when the recalc_slack_target for a path group has been met.

In block 404, the initialiazer logic 400 loops through each existing path_group for the integrated circuit design and applies values to variables based on settings in the configuration file 26. The following variables are initialized:

slack_target($group_name)=<user defined value>; User specified slack_target for a given path_group.

enable_recalc=true or false; Specifies whether or not to use path recalculation or path based analysis.

recalc_slack_target=<user defined value>; This is the slack target that must be met before path recalculation is turned on. Normally, this is a negative number. Once the recalc_slack_target is met, the leakage optimization manager 100 continues optimizing paths in a path_group until $slack_target($path_group) is met.

is_recalc_group($path_group)=1 or 0; Set to 1 if path recalculation is to be used for this path_group.

Figure 6A:
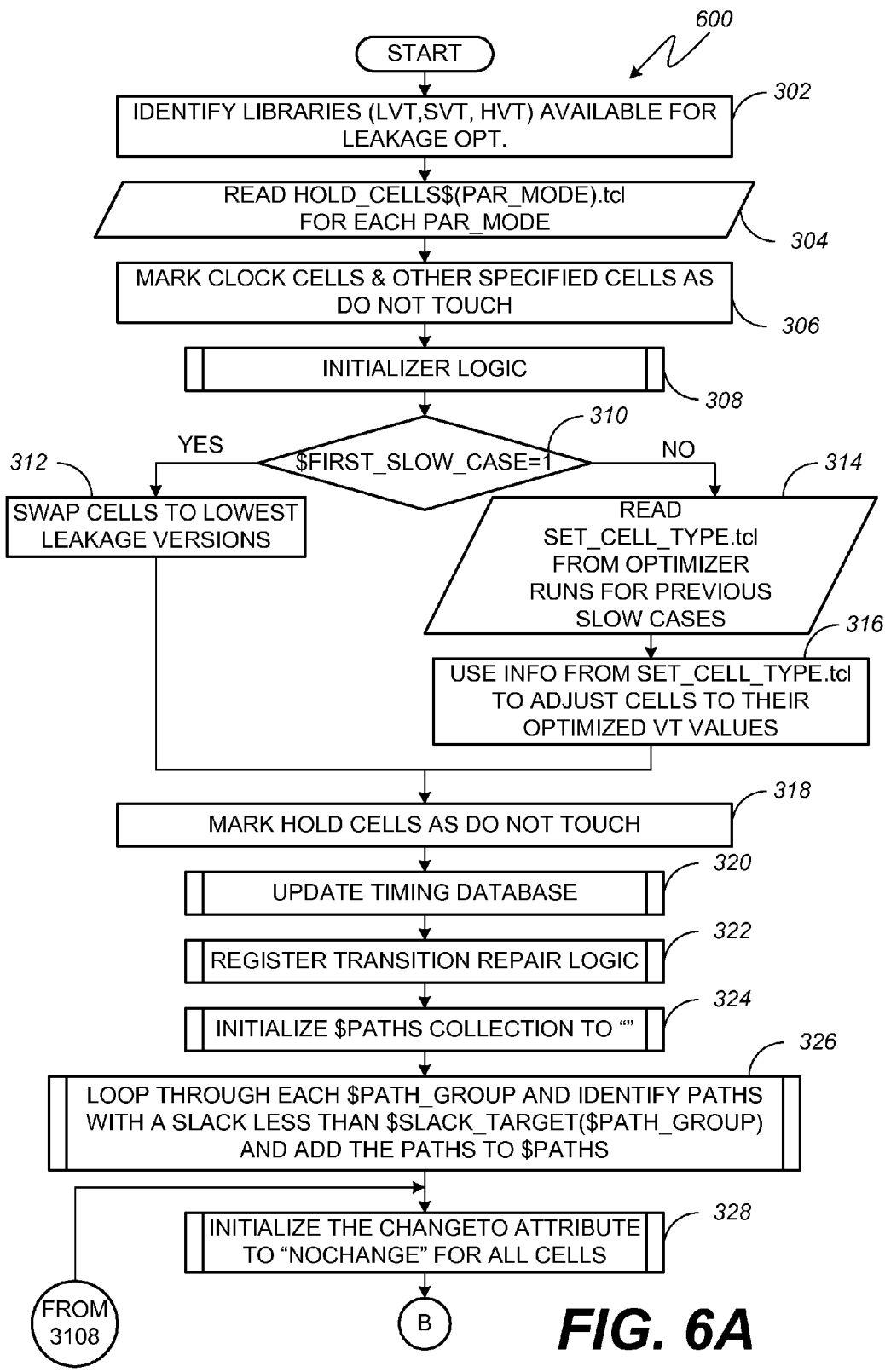
FIGS. 6A-6F include flow diagrams illustrating an example embodiment of the optimizer logic/module of FIG. 2 and FIG. 3.
Figure 6B:
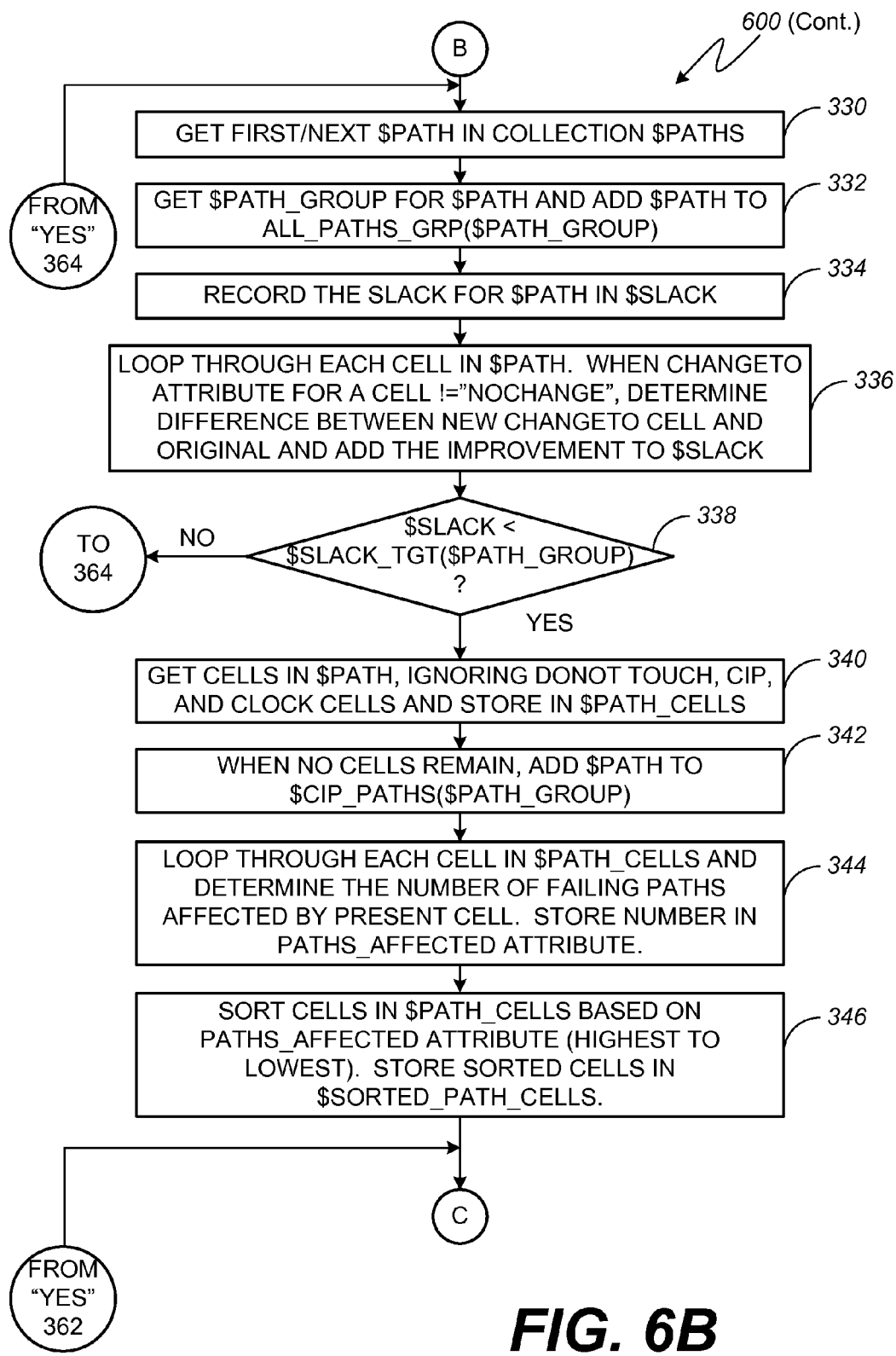
Figure 6C:
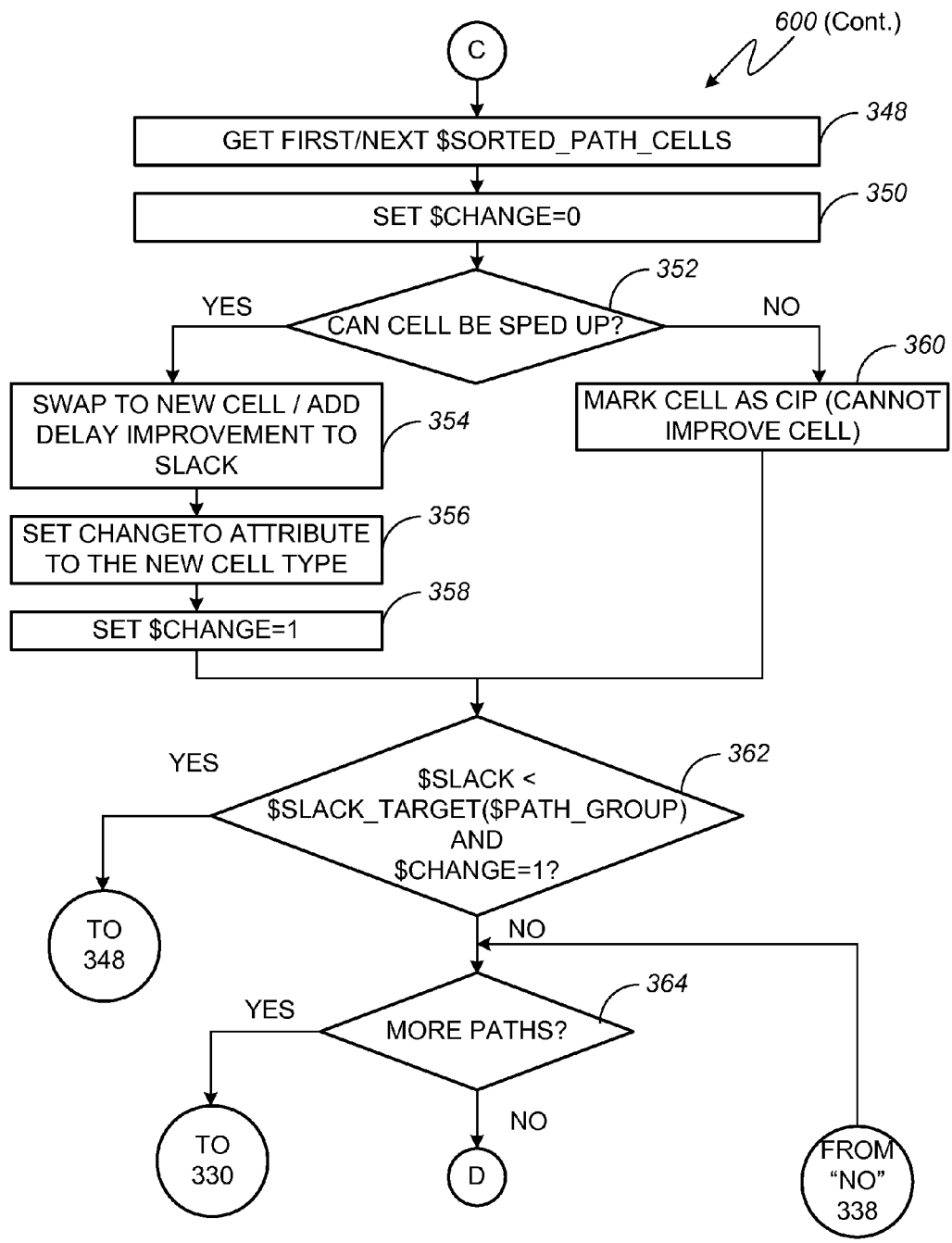

When the initializer logic 400 (e.g., the initialize_variables procedure) is completed, the optimizer logic 300 continues on to decision block 310 (FIG. 6A). If the first_slow_case variable is set to 1 (indicating that the first slow corner timing session is loaded), the procedure moves to block 312, where cells in the design (except for clock cells and dont_touch cells) are swapped to their lowest leakage versions. This is a key step in the leakage optimization algorithm and it guarantees that the procedure starts with the lowest possible leakage power (without changing cell footprints). This could be compared to starting with a clean slate and ultimately leads to the most efficient design from a leakage power perspective. Later on, the tool will start to swap faster, higher leakage, cells back into the design to fix timing paths and transition times, but it will do it in a very efficient manner.

If first_slow_case is set to 0, then the procedure moves to block 314 and reads in the information in cell type store 28 (e.g., set_cell_type.tcl) or file. The cell type store 28 contains the names of all the cells and their cell types used in the integrated circuit design. The cell types reflect the state of the design at the end of the leakage optimization step for the previous slow timing corners. In block 316, all the cells are swapped to the cell types specified by the cell type store 28 or set_cell_type.tcl file.

Both block 312 and block 316 continue on to block 318, where cells marked as hold_cells are also marked as dont_touch cells. After the cell swaps or marks, the timing database is updated. This is done in block 320. At this point, the cells have been swapped and the database has been updated. Now the optimizer logic 300 is prepared to swap in lower VT cells to fix timing paths and when timing is optimized, it will work on fixing transition times. Any transition time violations on register outputs are repaired first. There is a reason for this. Swapping register cells to a lower VT version not only affects the delay out of the register, it also affects the setup and hold times for paths into the register. If setup times become more pessimistic, timing margin could degrade and paths that were passing could now be failing after the swap. If register VT swaps happen before timing optimization, the optimizer logic 300 can compensate for changes in setup and hold times during the timing optimization step. Therefore, the next step is to execute the register transition repair logic 500 (e.g., the fix_register_transition_violations procedure) in block 322.

Figure 8A:
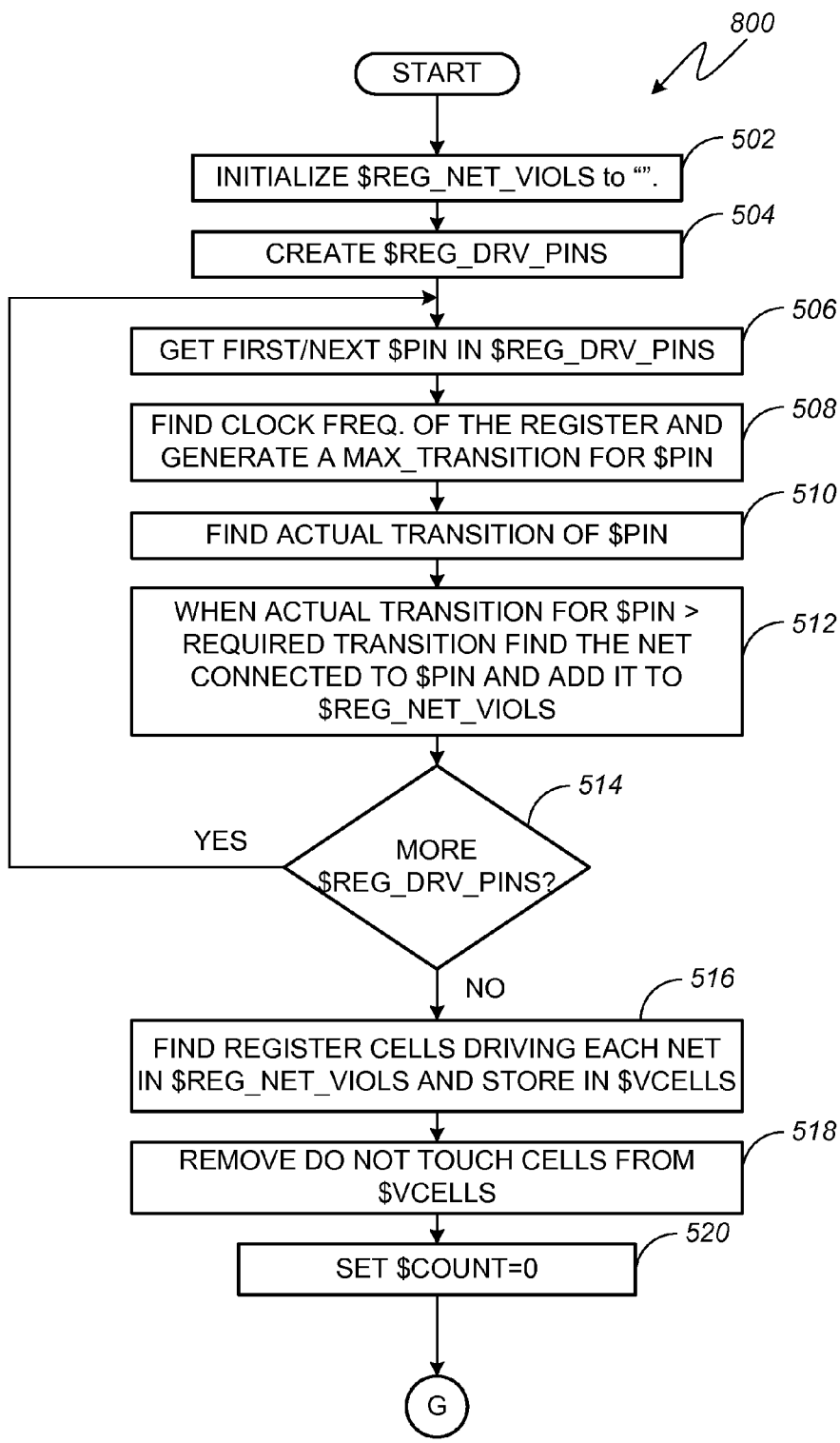
FIGS. 8A and 8B include flow diagrams illustrating an example embodiment of the register transition repair logic/module of FIG. 2 and FIG. 3.
Figure 8B:
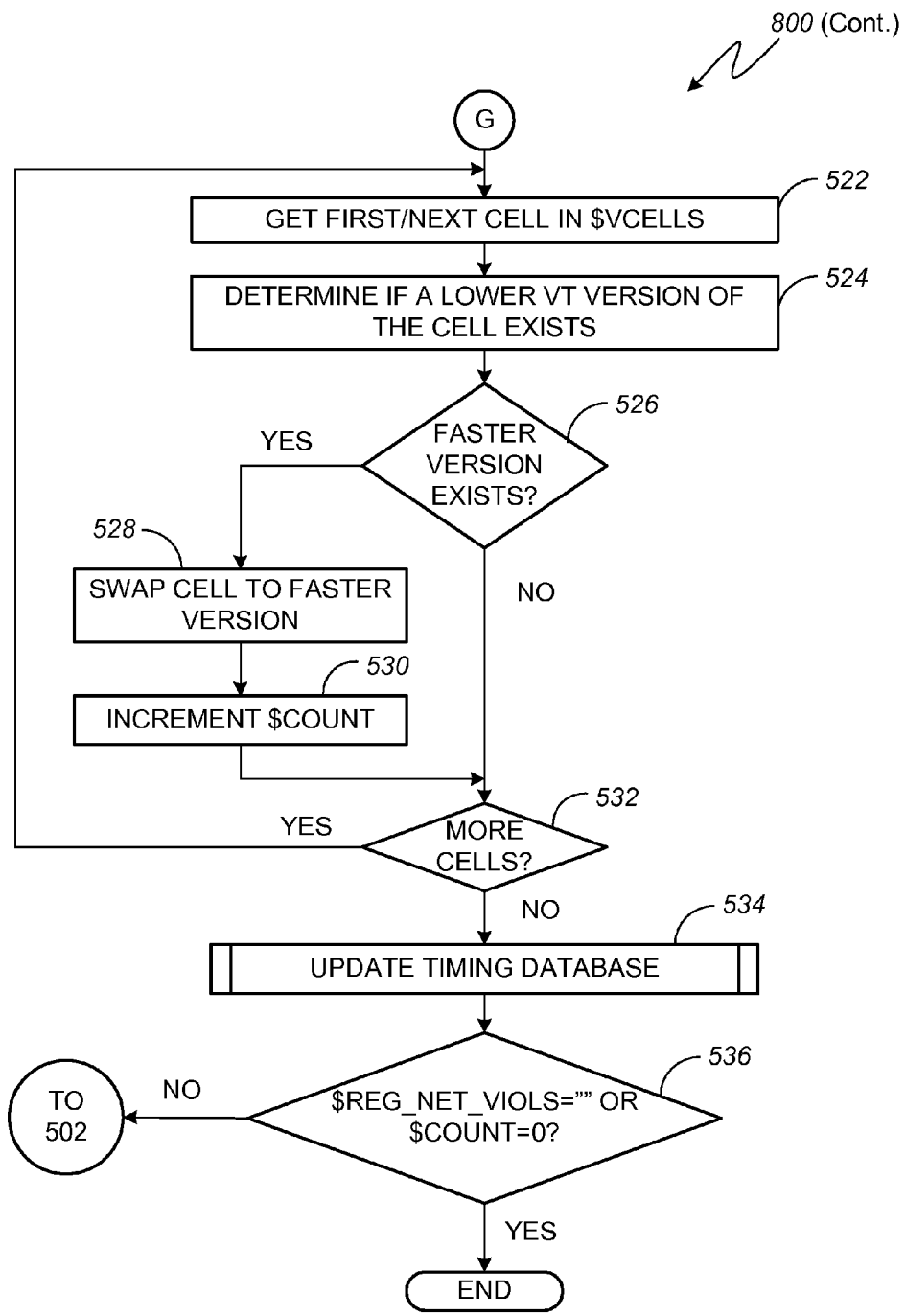

An example embodiment of the register transition repair logic is illustrated in FIGS. 8A-8B. In block 502, an empty collection called reg_net_viols is initialized. Next, in block 504, a collection of all the register driver (output) pins is stored in reg_drv_pins. In block 506, the first pin in the reg_drv_pins collection is selected. Then, in block 508, the frequency is found for the clock connected to the clock pin of the register of the selected pin. A maximum transition requirement is derived from this frequency. In block 510, the actual transition time for the selected register pin is recorded. Then, in block 512, the actual transition time for the pin is compared to the maximum transition requirement for the pin. If the maximum transition requirement is violated, the pin is added to the reg_net_viols collection. Decision block 514 checks if there are any more pins remaining in the reg_drv_pins collection. If so, the procedure goes back to block 506 and selects the next pin in the reg_drv_pins collection.

When all the pins in reg_drv_pins have been analyzed, the procedure moves to block 516, where all of the registers of the reg_net_viols pins are added to a collection of cells called vcells. In block 518, any cells marked dont_touch are removed from vcells. Next, a variable called count is initialized to 0 in block 520. Now the procedure will start to loop through the collection of vcells. In block 522, the first cell in vcells is selected. Next, in block 524, the procedure checks if a lower VT or faster version of the selected cell exists. Decision block 526 asks if a faster or lower VT version of the cell exists. If the answer is yes, the procedure continues on to block 528 and swaps the cell to the lower VT version. Then, in block 530, it increments the count variable and continues on to decision block 532.

If a lower VT version of the selected cell does not exist, the procedure moves straight to decision block 532, where it checks if there are more cells in the vcells collection that haven't been analyzed yet. If more cells exist, the procedure moves back to block 522 and selects the next cell in vcells. When the cells in vcells have been analyzed, the procedure moves to block 534 and updates the timing database. Decision block 536 checks if the reg_net_viols collection is empty or if the count variable is equal to 0. If the reg_net_viols collection is empty, this means no register transition violations exist and the procedure is done. If count equals 0, transition violations may still exist, but there are no more cell swaps that can be performed to avoid or repair these violations, so the procedure is considered to be complete. If reg_net_viols is not empty or if count does not equal 0, the procedure will go back to block 502 and will start to check for any more register transition violations.

When the register transition repair logic 500 is complete, the optimizer logic 300 continues on to block 324 (FIG. 6A) and initializes an empty collection called paths. In block 326, the procedure loops through each path_group in the design and collects failing paths for the path_group that violate slack_target($path_group), (the user specified slack target for the path_group). It then adds these failing paths to the paths collection. Next, in block 328, cells in the design are given a changeto attribute with the value "nochange." Now the procedure will start looping through each path in the paths collection. In block 330, the first path in the paths collection is selected. Then, in block 332, the path_group for the path is determined and the path gets added to the all_paths_grp ($path_group) collection. In block 334, the slack for the path is stored in the slack variable.

In block 336, the procedure loops through each cell in the path and looks at the value of the cells changeto attribute. If the changeto attribute is set to a new cell type, library data from the configuration file 26 and delay data from the current cell will be used to determine how much faster the new cell type is compared to the current cell type. If there is a delay improvement, it will be added to the current value of slack and stored in the slack variable. This may be better illustrated with an example. Suppose the slack for the path is −0.100 ns. The procedure will start to loop through the path cells and will encounter a cell that has the changeto attribute "avlvt_buf_a1". The cell currently has a cell type "avhvt_buf_a1". If the delay of the avhvt_buf_a1 cell is 0.200 ns and the configuration file 26 or cell library data specifies that the cell will speed up by 40% going from HVT to LVT, then we would see a delay improvement of 0.080 ns (0.4*0.200). This 0.080 ns value would get added to the slack value and would result in a new slack value of −0.020 ns. Then, the procedure will continue looping through the cells and modifying the slack variable.

At first, it may not be clear why the functionality associated with block 336 is present. If the leakage optimization manager 100 only analyzed one path at a time, it could use the slack for the path and determine how many cell swaps were needed to improve the slack enough to meet the required slack target. Then the timing database could be updated and the tool could move on to the next path. Doing this, however, would take a very, very long time. There could be thousands of failing paths that need to be analyzed and each timing update would take a significant period of time to complete. The result would be a tool that takes forever to execute and complete an optimization of the integrated circuit design. In order to improve runtime, the leakage optimization manager 100 analyzes thousands of paths between each timing update. Because it is working on multiple paths at a time, it keeps track of cell changes that could affect the timing for any of those paths. This is done in block 336, where the cell changes from other path optimizations are accounted for, and new timing slacks or margins are estimated.

Next, the procedure moves to decision block 338 and checks to see if the current value of slack is less than the required slack target. If the slack is greater than the required slack target, there is no more work to do on the current path and the procedure moves to decision block 364. If the slack is still less than the required slack target, the procedure will move to block 340. In this step path cells that are not clock cells and not marked as CIP or dont_touch cells are stored in a path_cells collection. (NOTE: CIP cells are cells that cannot be swapped to a lower VT or sped up so they can't be improved). Then, in block 342, if the size of path_cells collection is 0, the path is added to the cip_paths($path_group) collection, so it can be filtered from the failing paths at a later time. In block 344, the procedure loops through each cell in path_cells and determines how many other failing paths the cell affects or is part of. It stores this number in a paths_affected attribute for each cell. Then, in block 346, all the cells in path_cells are sorted by their paths_affected values and stored in a sorted_path_cells collection (the cell with the highest paths_affected value being first). This is another key step in the optimize leakage algorithm. Choosing to swap in lower VT versions for cells, affecting the highest number of failing paths first, gives your design the largest amount of timing improvement and results in a much smaller amount of low or lower VT cells being added.

Now the optimize leakage procedure is ready to loop through each cell in sorted_path_cells and look for cells that can be sped up. In block 348, the first cell in sorted_path_cells is selected. Then, in block 350, the variable change is initialized to 0. In decision block 352, the procedure determines if a lower VT or faster version of the cell exists. If a faster version exists, the procedure will go to block 354. Here, it will determine the delay improvement that will result from swapping to the faster cell and add this delay improvement to the current slack value. Next, in block 356, the new cell type will be stored in the changeto attribute for the cell. In block 358, the change variable will be set to 1 to indicate that at least one cell has changed or been improved. The procedure will continue on to decision block 362. If a faster version for the selected cell does not exist, the procedure will move from decision block 352 to block 360 and will mark the cell as a CIP cell, indicating that it can't be improved. Then the procedure will continue on to decision block 362.

Figure 6D:
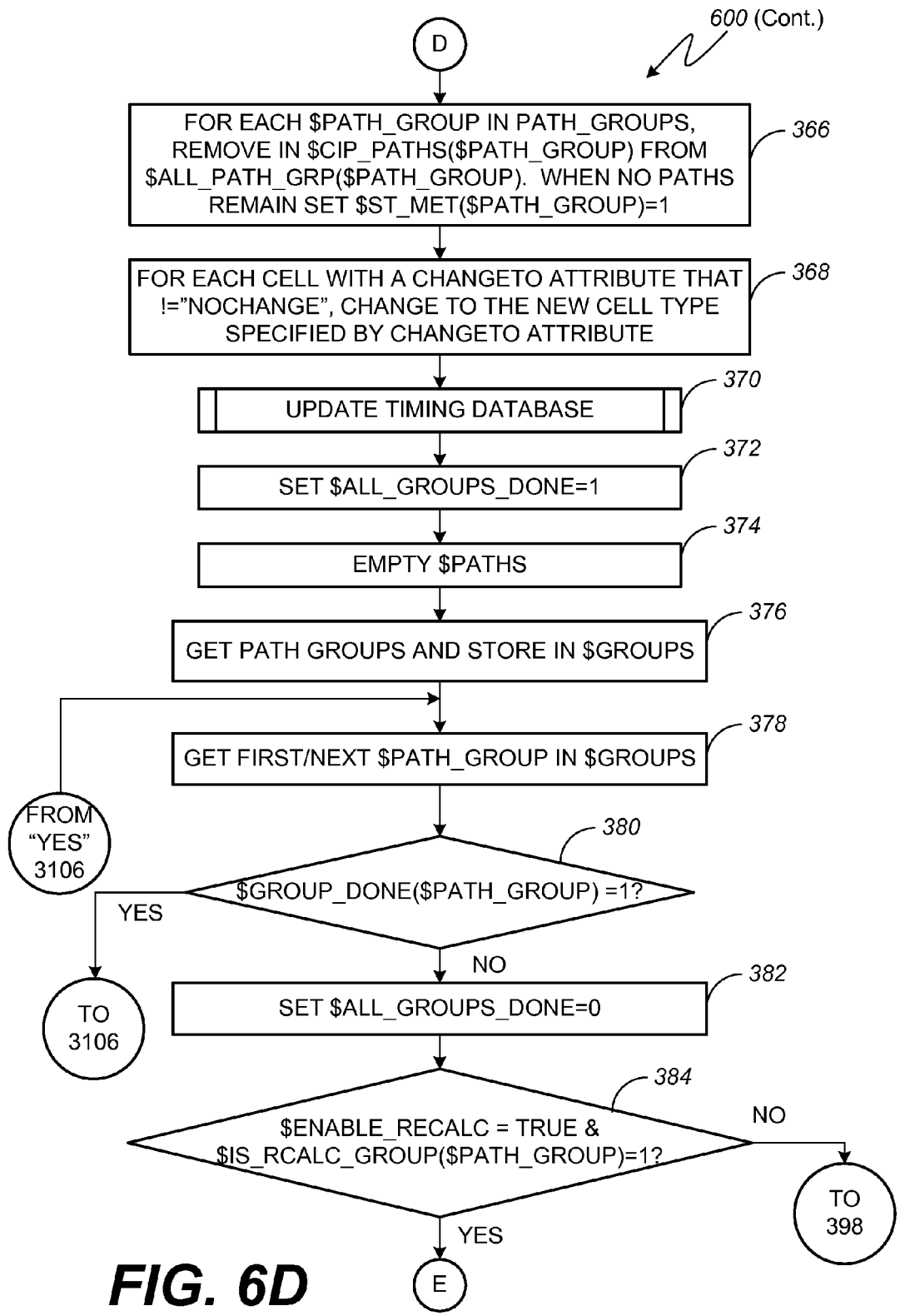
Figure 6E:
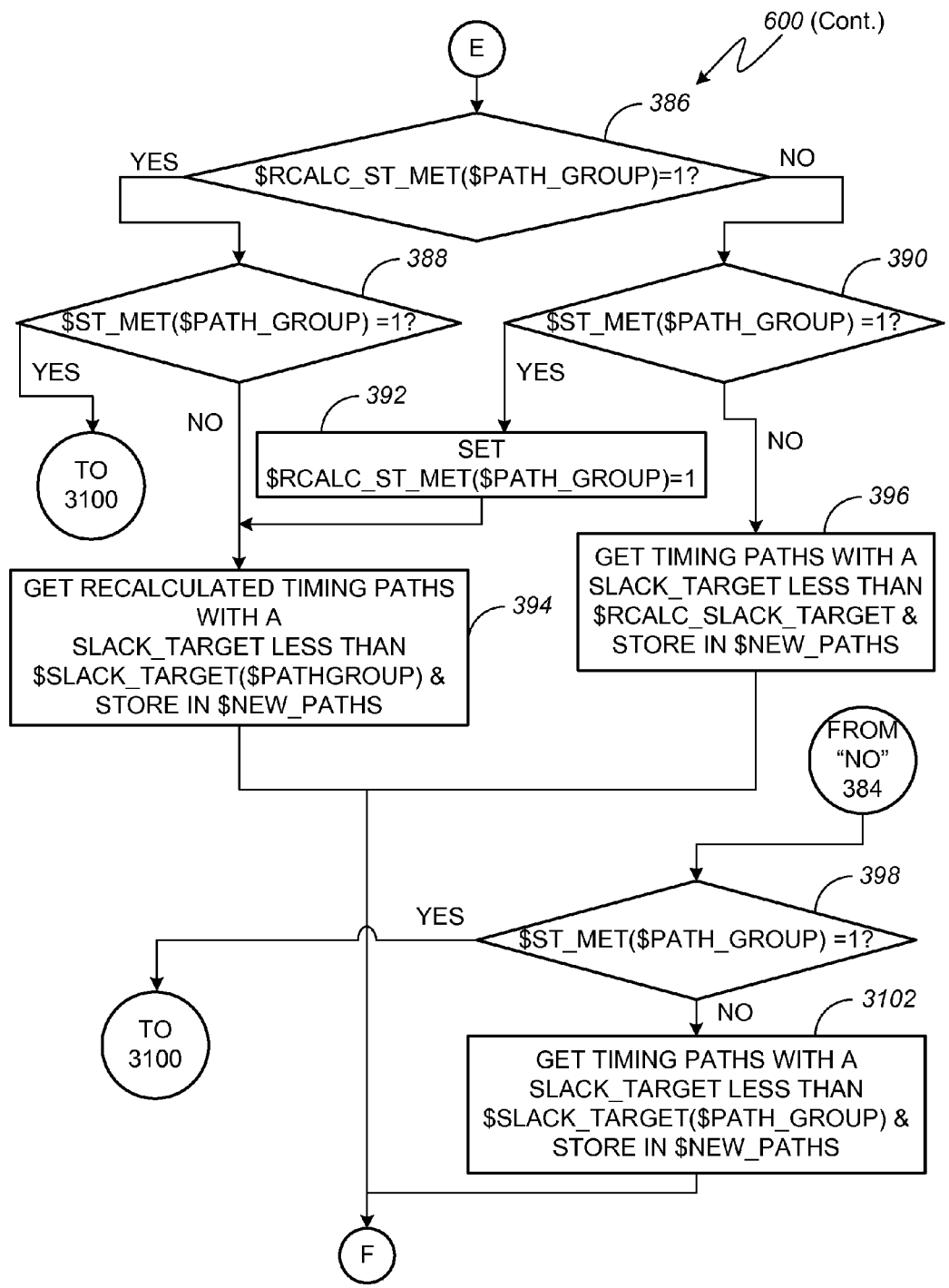
Figure 6F:
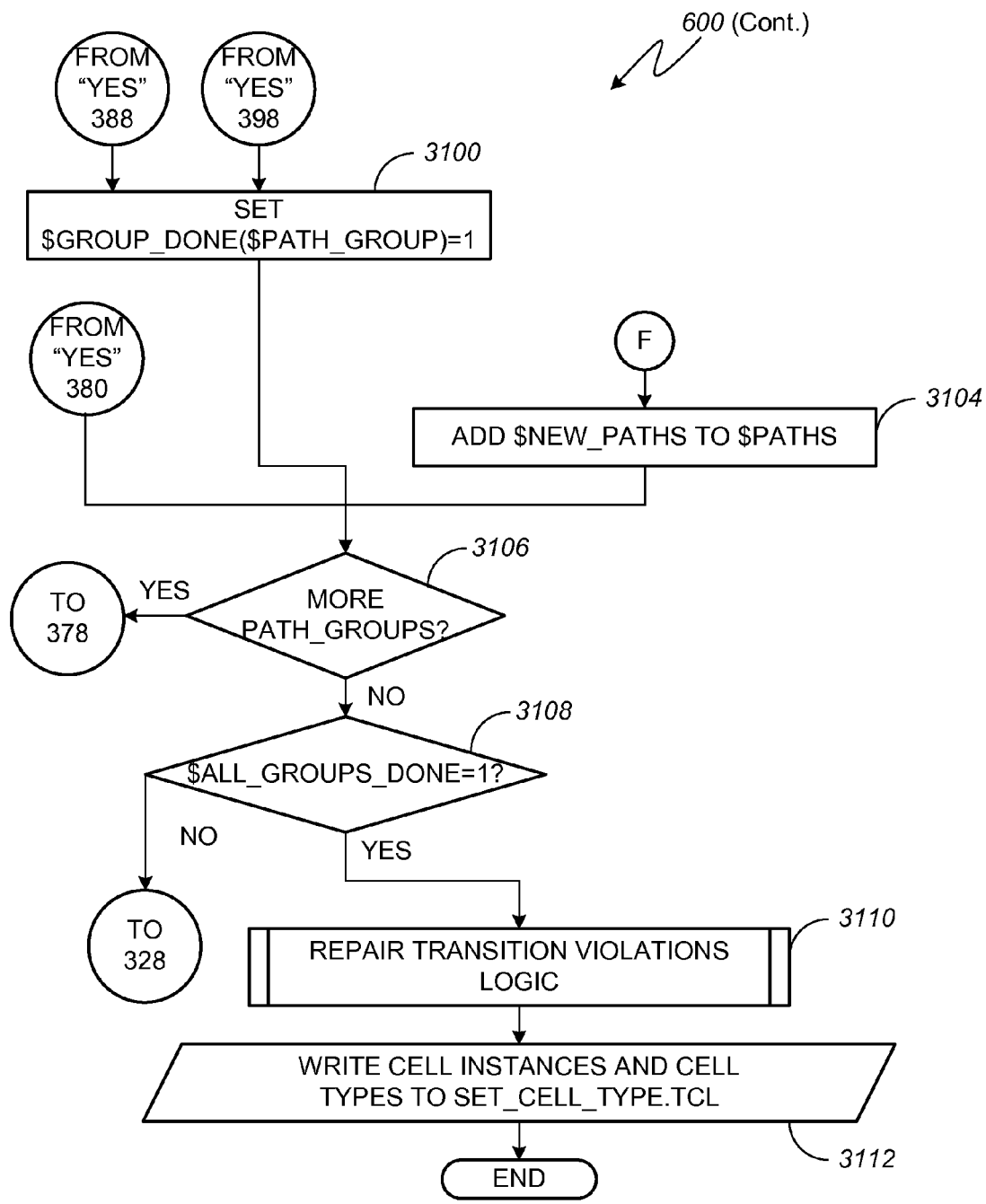

Decision block 362 checks if slack is still less than slack_target($path_group) and if change is equal to 1. If the path is still failing and at least one cell has been changed, the procedure will go back to block 348 and get the next cell in the sorted_path_cells collection. If the slack target for the group has been met or if no cells in the path can be improved (change=0), then the procedure will go to decision block 364 and check if more paths in the paths collection exist. If more paths exist, the procedure will go back to block 330 and get the next path in the paths collection. When the procedure has finished working on each path in the paths collection, it will move to block 366 (FIG. 6D).

In block 366, the procedure will loop through each path_group and remove any paths from the cip_paths($path_group) collection from the all_paths_grp($path_group) collection. If no paths remain in the all_paths_grp($path_group) collection, then the st_met($path_group) variable is set to 1, indicating that all the paths are either meeting their current slack target or they can't be optimized further. In block 368, the procedure loops through all the cells in the design that have a changeto attribute equal to something other than "nochange" and swaps the cells to the cell type specified by their changeto value. Then, in block 370, the timing database is updated.

In block 372, the all_groups_done variable is initialized to 1. In block 374, the paths collection is emptied and reinitialized to " ". Now the procedure is ready to loop through each path group, check if the slack targets have been met, and collect failing timing paths (if any) for the next iteration. In block 376, a collection of path groups is stored in groups. In block 378, the first path_group in groups is selected. Then, decision block 380 checks if the group_done($path_group) variable is set to 1. If it is, the procedure will continue on to decision block 3106. If group_done($path_group) is not set to 1, the procedure will go to block 382 and set the all_groups_done variable to 0. The only way for the all_groups_done variable to remain equal to 1 is if every group_done($path_group) variable is equal to 1. Next, decision block 384 will check if path recalculation is enabled (enable_recalc=true) and if so, is it enabled for the current path_group (is_rcalc_group($path_group)=1).

If both conditions in decision block 384 are not met, the procedure will go to decision block 398 and check if st_met ($path_group) is equal to 1. If st_met($path_group) is equal to 1 the procedure goes to block 3100, sets group_done ($path_group) to 1, and then goes to decision block 3106. If st_met($path_group) does not equal 1, the procedure will go to block 3102 and collect timing paths with slack less than slack_target($path_group) and store them in a collection called new_paths. Then, the procedure will go to block 3104.

If path recalculation is enabled and both conditions in decision block 384 are met, then the procedure will continue on to decision block 386 and check if the rcalc_st_met($path_group) is set to 1. If rcalc_st_met($path_group) is equal to 1, the procedure will go to decision block 388 and check if st_met($path_group) is equal to 1. If st_met($path_group) is equal to 1, then the procedure will go to block 3100, set group_done($path_group) to 1, and continue on to decision block 3106. If decision block 388 finds that st_met($path_group) is not equal to 1, the procedure will go to block 394.

If decision block 386 finds that rcalc_st_met($path_group) does not equal 1, the procedure will go to decision block 390 and check if st_met($path_group) is equal to 1. If st_met ($path_group) is equal to 1, the procedure will go to block 392 and will set rcalc_st_met($path_group) to 1, and will continue on to block 394. If decision block 390 finds that st_met($path_group) is not equal to 1, the procedure will go to block 396 and will collect timing paths with a slack target less than recalc_slack_target and store them in a collection called new_paths. From there the procedure will move to block 3104.

In block 394, the procedure will collect all recalculated timing paths (using path based analysis) with a slack less than slack_target($path_group) and store in them in a collection called new_paths. Then the procedure will go to block 3104. In block 3104, the new_paths collection will get added to the paths collection. Then the procedure will continue on to decision block 3106.

Decision block 3106 checks if any more path groups in the groups collection need to be analyzed. If so, the procedure will go back to block 378 and get the next path_group in the groups collection. If all of the path groups have been analyzed, the procedure will continue on to decision block 3108 and check if all_groups_done is equal to 1. If not, the procedure will go back to block 328 (FIG. 6A) and will start working on failing timing paths in the new paths collection.

If all_groups_done is equal to 1, the procedure has finished optimizing all the timing paths and will continue on to block 3110, where it will execute the transition violation repair logic 600 (e.g., the fix_transition_violations procedure).

Figure 9A:
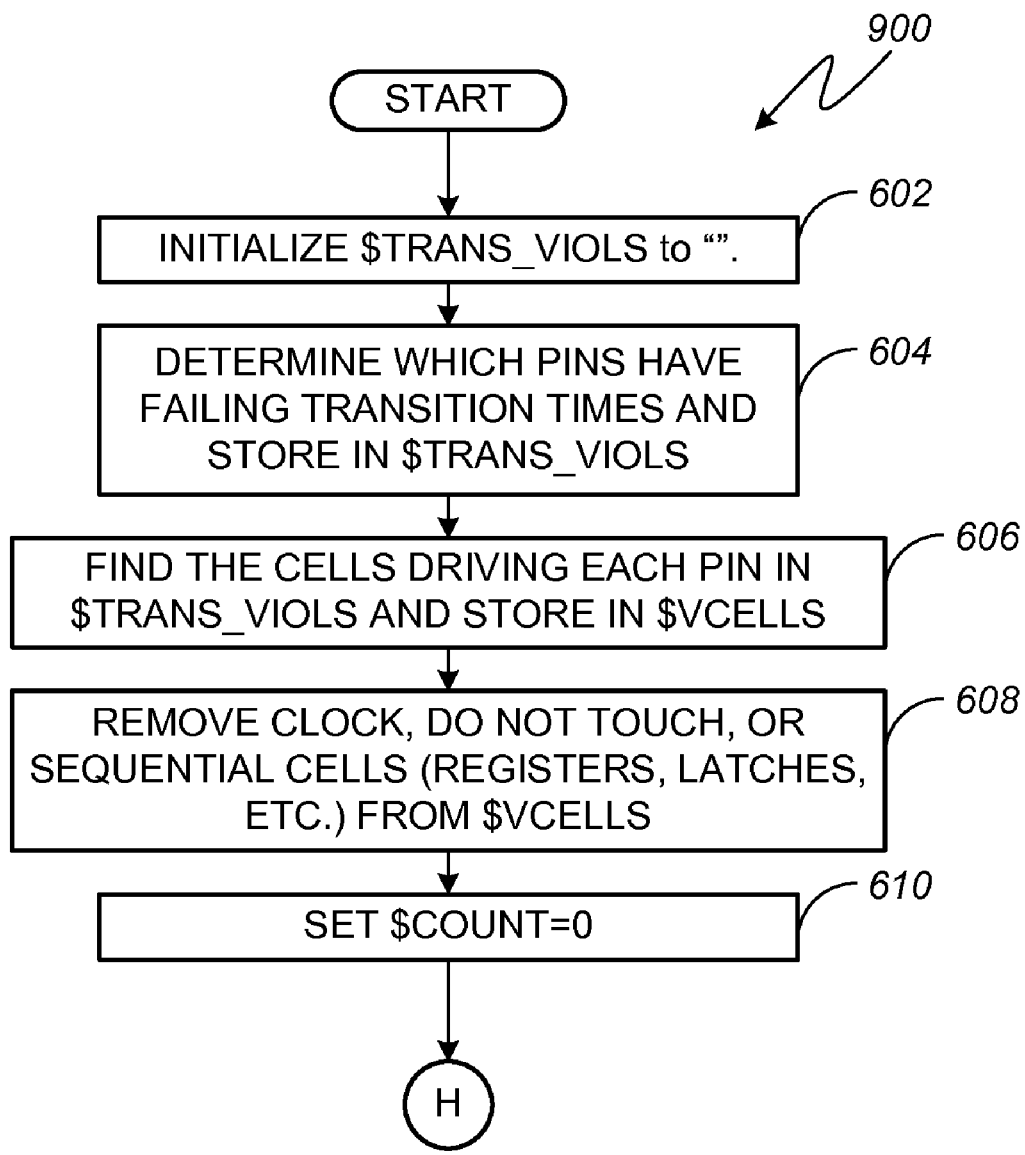
FIGS. 9A and 9B include flow diagrams illustrating an example embodiment of the transition violation repair logic/module of FIG. 2 and FIG. 3.
Figure 9B:
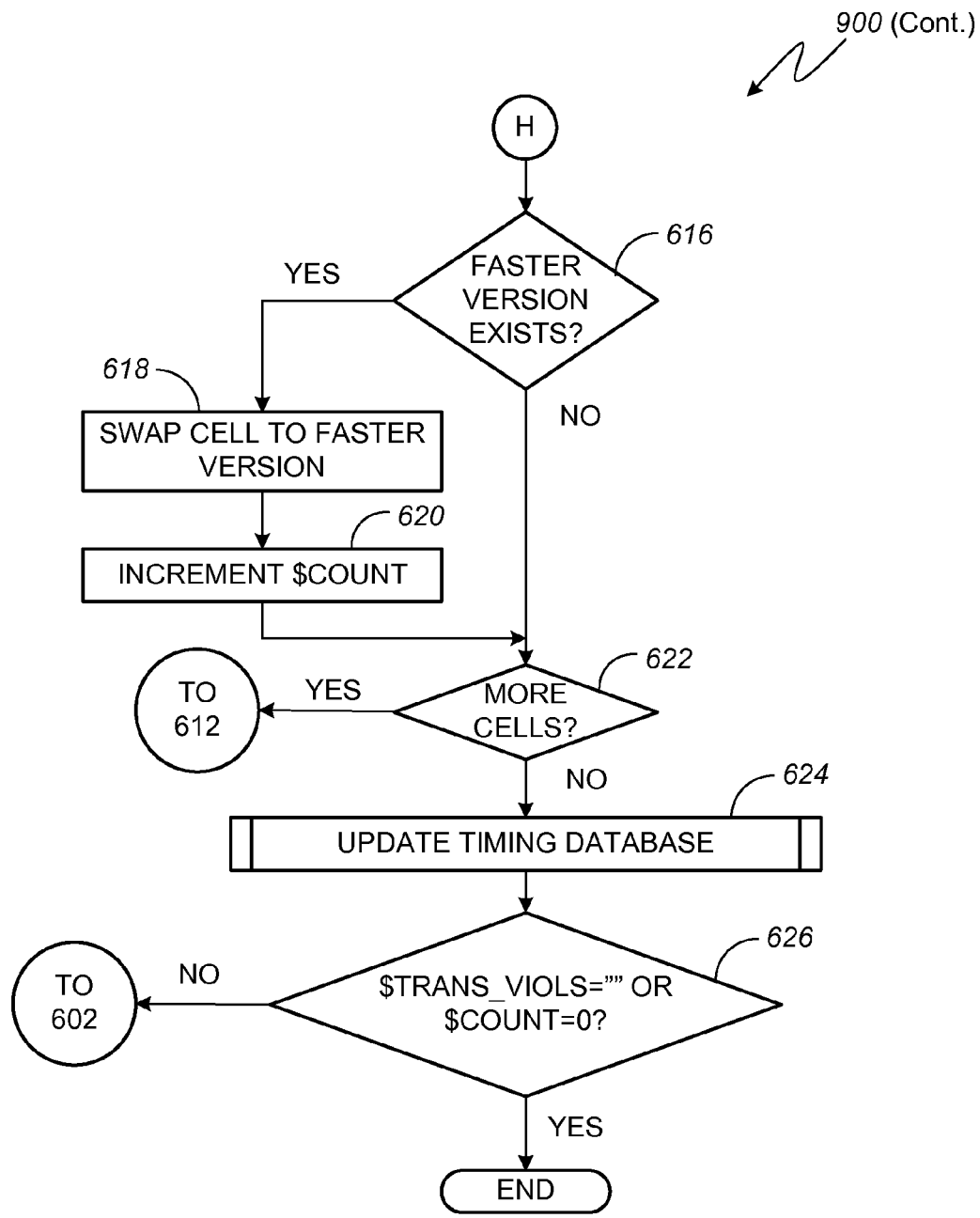

An example embodiment of the transition violation repair logic 600 is shown in FIGS. 9A-9B. The procedure starts by initializing the tran_viols collection to " " in block 602. In block 604, the procedure determines which pins have failing transition violations and stores them in the tran_viols collection. Those experienced in integrated circuit design will understand and know how to find pin transition failures. Consequently, a detailed description of how pin transition violations are identified is not required for an understanding of the present systems, methods, and computer-program products. However pin transition failures are identified, they are stored in a buffer or memory for later processing.

In block 606, the procedure finds all the cells that drive the nets connected to the pins in the tran_viols collection and stores them in a collection called vcells. Then, in block 608, any clock cells, dont_touch cells, or sequential cells (registers, latches, etc.) are removed from the vcells collection. In block 610, the count variable is initialized to 0. Therafter, the transition violation repair logic 600 loops through the cells in vcells and swaps them to lower VT versions when such versions are available.

In block 612, the first cell in the vcells collection is selected. Then, in block 614, the procedure checks for a lower VT version of the cell. Decision block 616 checks if a faster or lower VT version of the cell was found. If not, the procedure moves to decision block 622. If a lower VT version of the cell is found, the procedure goes to block 618 and swaps the cell to the lower VT version. Then, in block 620, the count variable is incremented by 1.

Decision block 622 checks if there are any more cells in the vcells collection that need to be analyzed. If there are, the procedure will go back to block 612 and select the next cell in the vcells collection. When all the cells have been analyzed, the procedure will go to block 624 and update the timing database. Then the procedure will continue to decision block 626 and check if the tran_viols collection is empty (indicating no more transition violations) or if the count variable is equal to 0 (indicating that no cells can be swapped to lower VT versions). If the tran_viols collection is not empty, or if count does not equal 0, the procedure will go back to block 602. If the tran_viols collection is empty, or if count is equal to 0, the procedure is finished and will return to block 3112 (FIG. 6F) of the optimizer logic 300.

Block 3112 is the last step of the optimizer logic 300. Here, the cells and their cell types are written or stored to the cell type store 28 (e.g., set_cell_type.tcl file). If information is already present in the cell type store 28, the information is overwritten.

When the optimizer logic 300 has completed, the leakage optimization manager 100 returns to decision block 120 (FIG. 4A). Decision block 120 determines if there are any more slow corner timing databases to analyze. If so, the procedure will go to block 122 and set the first_slow_case variable to 0. Then it will go to block 112 and load the next slow corner timing database. When all of the slow corner timing databases have been analyzed, the procedure will go to block 124.

At this point, the leakage optimization manager 100 has optimized timing, leakage power, and transition times for the slow timing corners. Now it will loop through the slow timing corners again, swap cells to the optimized cell types, update the timing database, and then write out timing and transition reports. It will also generate an ECO file that can be used by the router to fix transition times.

In block 124 (FIG. 4B), the first slow corner timing database is loaded (again). Then, in block 126, the first_slow_case variable is set to 1. In block 128, any extra constraints/commands from the configuration file 26 are applied or executed. Then, in block 130, the leakage optimization manager 100 will execute the generate ECO logic 800 (e.g., the generate_post_lkg_opt_data procedure).

Figure 10:
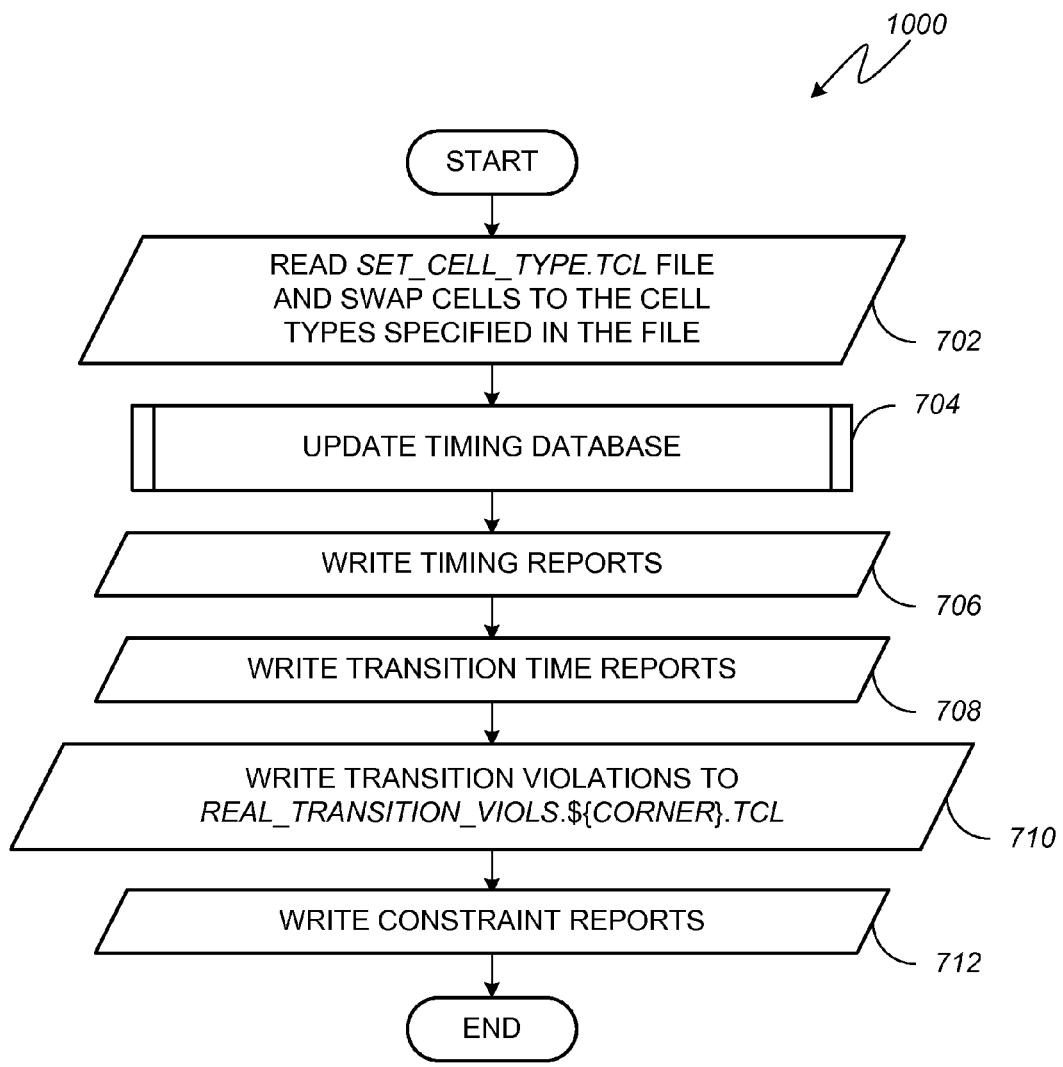
FIG. 10 is a flow diagram illustrating an example embodiment of the data transformer logic/module of FIG. 2 and FIG. 3.

An example embodiment of the generate ECO logic 800 is illustrated in the flow diagram of FIG. 10. The procedure starts with block 702, where the information stored in the cell type store 28 (e.g., the set_cell_type.tcl file) is read and cells in the design are swapped to the cell types specified by the file. The timing database is updated in block 704. In block 706, all setup and hold timing failures are written out to a set of timing report files. Then, in block 708, all transition time violations are written out to a file. These failures can be written to the optimization results store 31 or another suitable store. In block 710, data about pins with failing transition times is written to an output file (e.g., the real_transition_viols.${corner}.tcl). Finally, in block 712, any constraint violations (max_cap, max_fanout, etc.) are written out to a file. Then the procedure returns to block 132 (FIG. 4) of the main the leakage optimization manager 100.

In block 132 (FIG. 4B), the final timing database for the specific timing corner is written out using a save_session command in a format compatible with the timing analysis tool 12. This new 'saved session' represents what the new timing database will look like after the cells in the design are swapped to the cell types specified in the leakage optimization manager's cell store 28 (e.g., the set_cell_type.tcl file). This saved timing session can be loaded into the timing analysis tool 12 at a later time and used to generate more timing reports or debug timing paths.

Figure 11A:
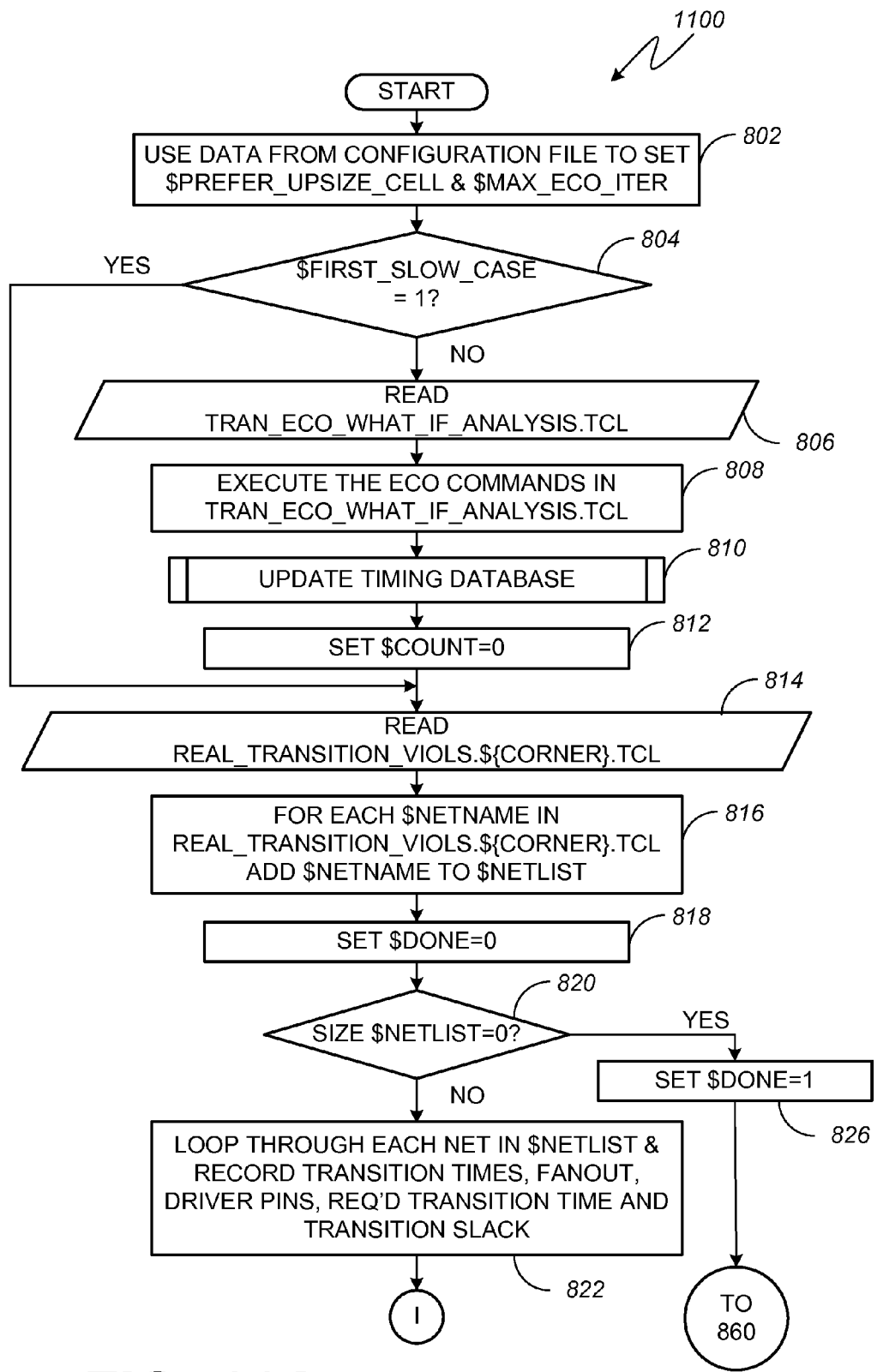
FIGS. 11A-11C include flow diagrams illustrating an example embodiment of the generate ECO logic/module of FIG. 2 and FIG. 3.
Figure 11B:
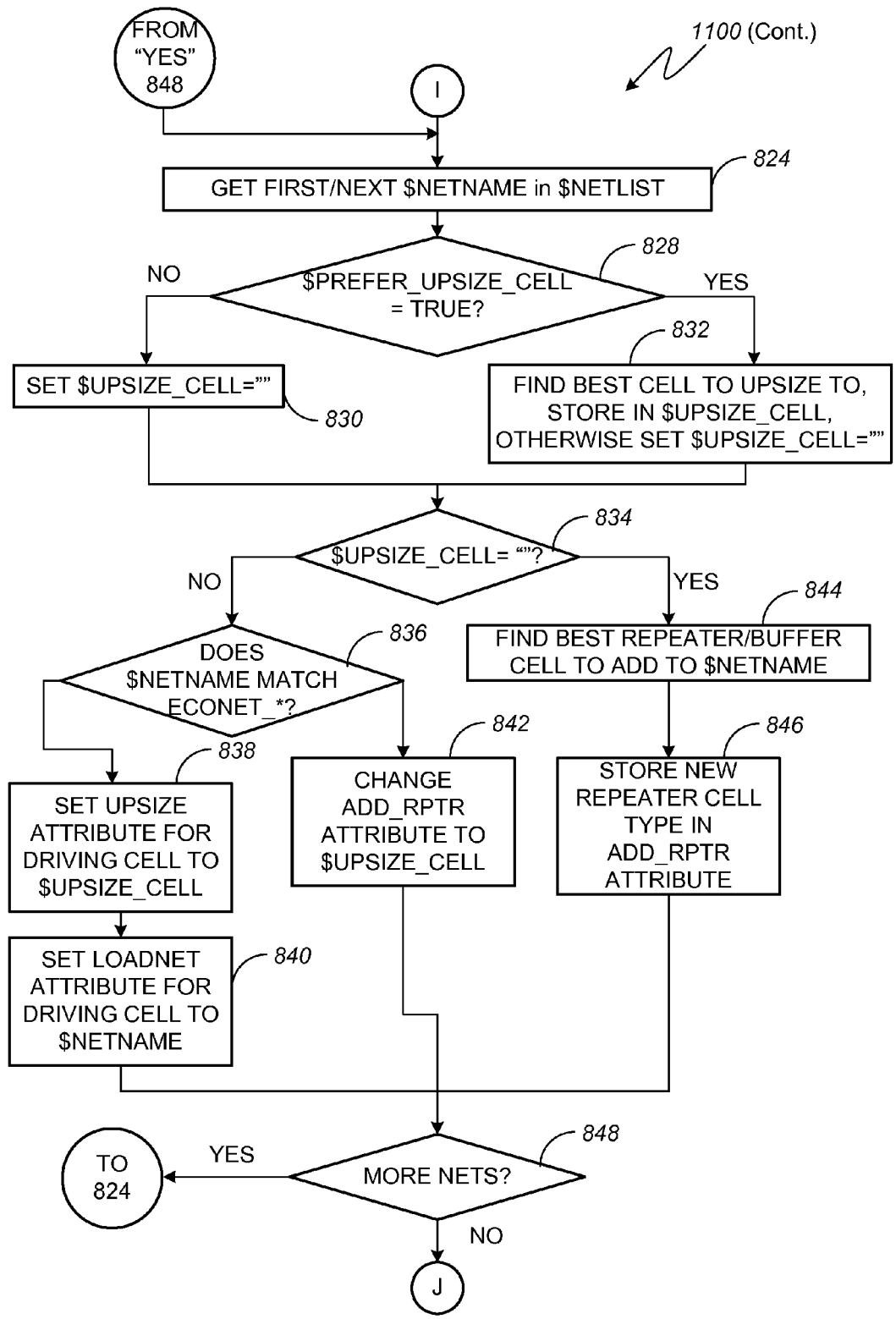
Figure 11C:
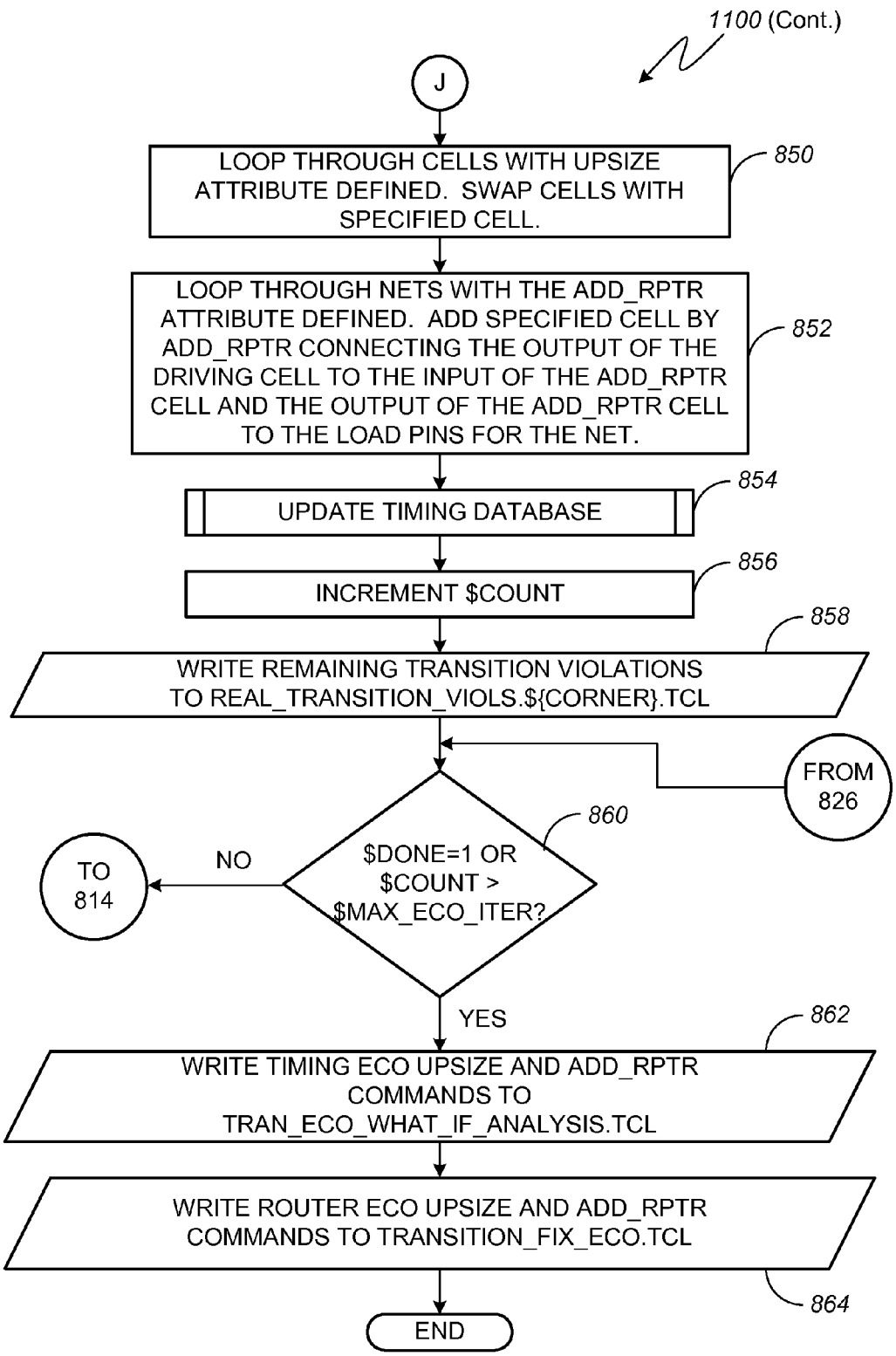

Next, in block 134, the leakage optimization manager 100 executes the generate ECO logic 800 (e.g., the create_transition_eco procedure). An example embodiment of the generate ECO logic 800 is shown in FIGS. 11A-11C. The procedure starts with block 802, where user configuration data is used to set the values of the prefer_upsize_cell and max_eco_iter variables. The procedure then goes to decision block 804 and checks if the first_slow_case variable is set to 1. If so, the procedure will go to block 812. If first_slow_case does not equal 1, the procedure will go to block 806 and read in tran_eco_what_if analysis.tcl file and in block 808 the generate ECO logic 800 will execute all the commands in the file. Then, in block 810, the timing database will be updated.

In block 812, a variable called count is initialized to 0. Then, in block 814, the real_transition_viols.${corner}.tcl file is read in. In block 816, the procedure loops through each net in the real_transition_viols.${corner}.tcl file and adds them to a collection called netlist. In block 818, a variable called done is set to 0. Then the procedure goes to decision block 820 and checks if the size of the netlist collection is equal to 0. If the netlist collection has a size of 0, the procedure will go to block 826 and set done to 1. Then it will continue on to decision block 860.

If the size of the netlist collection is larger than 0, the procedure will go to block 822 and loop through each net in netlist, gathering information about transition times, fan out, driver pins, required transition times, and transition slack. Now the procedure is ready to loop through each net in netlist and start creating eco commands. In block 824, the procedure will select the first netname in netlist. Decision block 828 checks if the prefer_upsize_cell variable is set to "true". If prefer_upsize_cell is not set to "true," the procedure goes to block 830, sets the upsize_cell variable to " " and continues on to decision block 834. If prefer_upsize_cell is set to "true," the procedure will go to block 832. Here, the generate ECO logic 800 will use information from the net to find the best cell version to upsize the current cell to and will store the new cell type in the upsize_cell variable. Upsizing a cell means that a new, higher drive strength, cell is swapped for the original cell. If the generate ECO logic 800 cannot find a decent cell to upsize the current cell to, it will set the upsize_cell variable to " ". Then the procedure will continue to decision block 834.

Decision block 834 checks if the upsize_cell variable is set to " ". If so, the procedure will go to block 844, find the best repeater or buffer cell to add to netname, and in block 846, the generate ECO logic 800 will store the new cell type in the ADD_RPTR attribute for the net. From there, the generate ECO logic 800 will go to decision block 848. If the upsize_cell variable is not set to " ", the procedure will go to decision block 836 and check if netname matches ECONET_*. If so, then in block 842, the generate ECO logic 800 will set the ADD_RPTR attribute for netname to the cell type value stored in upsize_cell and continue on to decision block 848. If decision block 836 finds that netname does not match ECONET_*, the procedure will go to block 838 and set the UPSIZE attribute for the driving cell to the value specified in the upsize_cell attribute. Then, in block 840, the LOADNET attribute for the driving cell will be set to netname. Then, the generate ECO logic 800 will continue to decision block 848.

The create_transition_eco procedure has two choices for fixing transition times on a net, either 'upsizing' a driver cell or 'adding a repeater' to the net with a bad transition time. If the load on a net is too large for the cell driving the net, swapping the driving cell to a higher drive strength cell can improve the transition time on that net. Swapping a cell to a higher drive strength will cause an increase in the area of the cell, but may be less disruptive to the overall design compared to the impact of adding a repeater. If a higher drive strength cell does not exist, then the procedure will use the option of adding a repeater instead.

When a repeater is added to a net, the net gets split into two nets. The first net is connected to the input of the repeater cell that is being added. The first net will also keep its same name, netname. The second net will be connected to the output of the new repeater cell and will be renamed to ECONET_netname. By splitting up the net, the load is reduced on both segments of the net. Now the original driver of the net is driving a smaller load on the first segment, so the transition time should be improved. The repeater that is added to drive the second segment should be large enough to drive the load of the second segment and no transition failure should exist. However, if the procedure finds a transition time failure on a net that matches ECONET_* in another iteration, this would indicate that the repeater that was added earlier did not have a high enough drive strength. If this is the case, and prefer_upsize_cell is set to "true," the generate ECO logic 800 will increase the size of the repeater it added in the previous iteration. This is what is happening in block 842. If a transition failure is found on a net that matches ECONET_* and prefer_upsize_cell is set to "false," then another repeater will get added to the ECONET_netname net in block 844.

After the create_transition_eco procedure is done finding a cell to upsize or a repeater to add for a net, it goes to decision block 848 and checks if there are more nets in netlist that need to be analyzed. If so, the procedure will go back to block 824 and select the next netname in netlist.

When all the nets in netlist have been analyzed, the generate ECO logic 800 will move on to block 850. Here, the generate ECO logic 800 will loop through all the cells with an UPSIZE attribute and swap the cells to the cell types specified in the cell's UPSIZE value. Next, in block 852, the generate ECO logic 800 will loop through all the nets with an ADD_RPTR attribute and will add a repeater, with the cell type specified by the value of the ADD_RPTR attribute, onto each net. In block 854, the timing database will be updated. Then, in block 856, the count variable will be incremented by one. In block 858, the procedure will find any new or remaining transition violations and will write them to the real_transition_viols.${corner}.tcl file. Then the generate ECO logic 800 will continue with decision block 860.

Decision block 860 checks if the done variable is set to 1 or if the value of count is greater than the maximum number of iterations specified in the mac_eco_iter variable. If both of these conditions are false, then the generate ECO logic 800 will go back to block 814 for another iteration of finding or improving transition ECO commands. If done is equal to 1 or if count exceeds the value of max_eco_iter, the procedure will go to block 862 and write all of the timing ECO commands for upsizing driver cells and adding repeaters to the tran_eco_what_if analysis.tcl file. Finally, in block 864, the generate ECO logic 800 will write all of the router ECO commands for upsizing cells and adding repeaters to the transition_fix_eco.tcl file. Then the generate ECO logic 800 will return to decision block 136 (FIG. 4B) of the leakage optimization manager 100.

Decision block 136 checks if more slow corner timing databases remain to be analyzed. If so, the leakage optimization manager 100 will go to block 138, set first_slow_count to 0, and then continue to block 124 where the leakage optimization manager 100 will load the next slow corner timing database.

When all of the slow corner timing databases have been analyzed, the leakage optimization manager 100 will loop through all the fast corner timing databases and write out timing, transition, and constraint reports. In block 140, the leakage optimization manager 100 will load the first fast corner timing database. Then, in block 142, any extra constraints/commands will be applied or executed. In block 144, the leakage optimization manager 100 will execute the data transformer logic 700 (e.g., the generate_post_lkg_opt_data procedure, which was described earlier) in order to write out timing reports, transition time reports, and constraint violation reports. Next, in block 146, the leakage optimization manager 100 will save a timing session for the fast corner timing database.

Decision block 148 will check if there are anymore fast corner timing databases to be analyzed. If so, the leakage optimization manager 100 will go back to block 140. If no fast corner timing databases remain, the leakage optimization manager 100 is finished.

Outputs

The leakage optimization manager 100 (or subroutines under the execution thereof) generates the following information:

set_cell_type.tcl: This file contains the cell types for the design after it has been fully optimized by the leakage optimization manager 100. This file should be used to change cells in the design database to the new cell types. After this is done, backend checks (DRC, LVS, etc) can be rerun. Note, there should be no new DRC or LVS failures after these cell swaps happen (this is one of the advantages of using the leakage optimization manager 100). GDS for the database can be generated, RC extraction can be run, and then static timing analysis can be run. If the only changes to the database are the leakage optimization manager 100 directed cell swaps, then the new timing results should be exactly the same as the timing reports that were written out by the the leakage optimization manager 100 (another big advantage of using the leakage optimization manager 100).

transition_fix_eco.tcl: This file contains suggested router ECO commands for fixing transition time violations in the design that the leakage optimization manager 100 was unable to fix using VT cell swaps. NOTE: the leakage optimization manager 100 has estimated the timing impact of performing this commands by using 'what if' analysis in the generate ECO logic 800, but there is no guarantee how the router will implement these ECO fixes and the actual timing impact they will have. The ECO commands in this file should be reviewed by a design engineer before forwarding the commands to the router. If the router performs any of the ECOs specified by this file, it is possible to get different timing results than the leakage optimization manager 100 predicted values.

LKG_OPT_VT_RESULTS.summary: This file shows the percentages of all the LVT, SVT, and HVT cells before and after leakage optimization. This information is saved in the optimizer results store 31.

Timing, Transition, and Constraint failure reports: These reports are output at the end of the leakage optimization manager 100 run. These reports can be saved in the reports store 32. If there are failures in these reports that are unacceptable, then the user may need to modify settings in the leakage optimization manager configuration file 26 OR go back to early steps in the block build flow to make more significant changes.

Saved timing sessions: These saved timing sessions should reflect the timing of the optimized design and can be loaded into a timing analysis tool (e.g., PrimeTime) so the user can create their own custom timing reports or debug timing paths. Saved timing sessions are stored in sessions store 33.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill to utilize various embodiments of the present systems, programs and methods for analyzing an integrated circuit model. All such modifications and variations are within the scope of the appended claims when interpreted in accordance with the breadth to which they are fairly and legally entitled.

What is claimed is:

1. A method for optimizing power consumption and timing in an integrated circuit design, the method performed by a programmed computer in conjunction with a timing tool and an integrated circuit model defined by a placement and routing tool, the method comprising:

receiving configuration information including an integrated circuit model generated by a placement and routing tool, path specific variables, and a first run-time option associated with a timing path group;

preserving timing critical hold paths by identifying cells in the hold timing paths and storing an identifier for the cells in a hold cells storage element;

performing, using said programmed computer, a leakage power optimization analysis on the integrated circuit model that is responsive to a slow corner timing database and timing constraints for a slow corner, the leakage power optimization analysis configurable in accordance with the path specific variables and including a routine that repairs register transition violations, wherein the leakage power optimization analysis is performed on a select number of paths before an adjusted timing slack value is determined and wherein cells are addressed in response to a number of failing timing paths associated with a cell, the leakage optimization analysis storing cell instances and types in a second storage element;

receiving information from the second storage element and swapping cells with specified cell types;

updating a timing database in response to modified cells;

identifying and storing register transition violations in a third storage element; and generating information in a router compatible format that identifies a desired modification of the integrated circuit design, wherein identified hold timing failures on input/output paths are addressed by inserting a circuit element at the top level of the integrated circuit model.

2. The method of claim 1, wherein preserving timing critical hold paths further comprises:

loading into a buffer coupled to a processor, a first fast corner timing database and timing constraints for a fast corner, the timing constraints including a hold margin;

applying the lowest leakage version of a cell when multiple versions of a cell exist;

updating a timing database in response to modified cells; and identifying hold timing paths with slack less than a desired hold slack margin.

3. The method of claim 2, wherein applying the lowest leakage version of a cell excludes clock cells.

4. The method of claim 2, wherein identifying hold timing paths with slack less than a desired hold slack margin applies to paths inside a block.

5. The method of claim 1, wherein performing a leakage optimization analysis on the integrated circuit model further comprises:
   identifying the presence of a path that cannot be improved; and
   ignoring the path that cannot be improved when executing the leakage optimization.

6. The method of claim 1, wherein register transition violations are addressed before swapping cells.

7. The method of claim 1, wherein paths that share a common trait are analyzed together.

8. A program embodied in a non-transitory computer-readable medium for optimizing power consumption and verifying timing in an integrated circuit design, the program comprising:
   logic configured to load a configuration file, iteratively load a fast corner timing database and timing constraints and direct the execution of logic in a hold cell module configured to identify cells in hold timing paths;
   logic configured to iteratively load a slow corner timing database and timing constraints and direct the execution of logic that performs a leakage power optimization analysis of the integrated circuit design, the leakage power optimization analysis ignoring cells in hold timing paths and repairing register transition violations, wherein the leakage optimization analysis is performed on a select number of paths before an adjusted timing slack value is determined and wherein cells are addressed in response to a number of failing timing paths associated with a cell;
   logic configured to iteratively load a slow corner timing database and timing constraints and direct the execution of logic that generates data responsive to a modified integrated circuit design responsive to the leakage power optimization analysis, the logic further configured to save a timing session and direct the execution of logic that generates information in a router compatible format that identifies a desired modification of the integrated circuit design; and
   logic configured to iteratively load a fast corner timing database and timing constraints and direct the execution of logic that generates data responsive to the modified integrated circuit design, the logic further configured to save the timing session by overwriting changes to a previously stored timing session, wherein identified hold timing failures on input/output paths are addressed by inserting a circuit element at the top level of the integrated circuit design.

9. The program of claim 8, wherein the hold cell module comprises logic configured to swap cells to their lowest leakage version when an alternative version of the cell exists, update the timing database, identify hold timing paths with slack less than a desired hold slack margin.

10. The program of claim 9, wherein the hold cell module comprises logic configured to process paths within a block.

11. The program of claim 8, wherein the leakage power optimization analysis identifies the presence of a path that cannot be improved and ignores the same when executing the leakage optimization.

12. The program of claim 8, wherein register transition violations are addressed before swapping cells and paths that share a common trait are analyzed together.

13. The program of claim 8, further comprising:
   logic configured to generate timing reports including transition time reports and further including remaining transition violations.

14. The program of claim 8, further comprising:
   logic configured to generate information in a router compatible format that identifies a desired modification of the integrated circuit design.

15. An integrated circuit model timing analysis system, comprising:
   an interface for receiving a set of operational parameters, the operational parameters identifying a cell library including cells that perform the same function implemented with transistors having different threshold voltages, the operational parameters further identifying timing constraints and timing corners to use for hold path timing analysis and leakage optimization analysis, identifying a number of paths to be analyzed simultaneously and a number of iterations to be used when generating changes to the integrated circuit model;
   a memory containing a hierarchical arranged static timing model of an integrated circuit design under test, the hierarchical model comprising a plurality of blocks, the blocks including at least one cell, the memory further containing leakage optimization manager logic, hold cell logic, optimizer logic, initializer logic, register transition repair logic, and data transformer logic modules; and
   a processor coupled to the memory and the interface, the processor configured to execute commands stored in the leakage optimization manager logic, hold cell logic, optimizer logic, initializer logic, register transition repair logic, and data transformer logic modules in the memory, the commands directing the processor to identify cells in hold timing paths, perform a leakage power optimization analysis on the integrated circuit model, the leakage power optimization analysis being performed on a select number of paths before an adjusted timing slack value is determined and wherein cells are addressed in response to a number of failing timing paths associated with a cell, swapping cells with specified cell types, updating a timing database in response to modified cells, identifying and storing register transition violations in the memory and generating information in a router compatible format that identifies a desired modification of the integrated circuit design, wherein timing failures on input/output paths are addressed by inserting a circuit element at the top level of the integrated circuit model.

16. The system of claim 15, wherein hold timing paths do not include paths that communicate clock signals or input/output signals that traverse a block boundary.

17. The system of claim 15, wherein the leakage optimization analysis includes:
   identifying the presence of a path that cannot be improved; and
   ignoring the path that cannot be improved when executing the leakage optimization.

* * * * *